United States Patent
Nadimpally et al.

(10) Patent No.: US 11,245,355 B2
(45) Date of Patent: Feb. 8, 2022

(54) SOLAR ROOF TILE MODULE

(71) Applicant: TESLA, INC., Palo Alto, CA (US)

(72) Inventors: Bhavananda R. Nadimpally, San Jose, CA (US); Peter P. Nguyen, San Jose, CA (US); Mykola O. Pashkevych, Fremont, CA (US); Bobby Yang, Dublin, CA (US)

(73) Assignee: Tesla, Inc., Austin, TX (US)

( * ) Notice: Subject to any disclaimer, the term of this patent is extended or adjusted under 35 U.S.C. 154(b) by 0 days.

(21) Appl. No.: 16/121,457

(22) Filed: Sep. 4, 2018

(65) Prior Publication Data

US 2020/0076352 A1 Mar. 5, 2020

(51) Int. Cl.
*H02S 20/25* (2014.01)
*H01L 31/048* (2014.01)
(Continued)

(52) U.S. Cl.
CPC ............... *H02S 20/25* (2014.12); *E04D 1/30* (2013.01); *H01L 31/0201* (2013.01);
(Continued)

(58) Field of Classification Search
CPC . H02S 20/25; H01L 31/0488; H01L 31/1876; H01L 31/0201; H01L 31/042;
(Continued)

(56) References Cited

U.S. PATENT DOCUMENTS 352,424 A 11/1886 Owen et al.
3,076,861 A 2/1963 Samulon
(Continued)

FOREIGN PATENT DOCUMENTS

CN 102544380 8/2015
CN 103426957 3/2016
(Continued)

OTHER PUBLICATIONS

Bulucani et al., "A new approach: low cost masking material and efficient copper metallization for higher efficiency silicon solar cells" 2015 IEEE.
(Continued)

*Primary Examiner* — Basil S Katcheves
*Assistant Examiner* — Omar F Hijaz
(74) *Attorney, Agent, or Firm* — Dentons US LLP

(57) ABSTRACT

One embodiment can provide a photovoltaic roof tile module. The photovoltaic roof tile module can include a photovoltaic roof tile module. The photovoltaic roof tile module can include at least: a first photovoltaic roof tile and a second photovoltaic roof tile positioned adjacent to each other, and a spacer coupled to and positioned between the first and second photovoltaic roof tiles. A respective photovoltaic roof tile can include front and back glass covers, and multiple cascaded strings encapsulated between the front and back glass covers. A respective cascaded string can include a plurality of photovoltaic structures electrically coupled to each other in series, and the multiple cascaded strings can be electrically coupled to each other in parallel. The first and second photovoltaic roof tiles can be electrically coupled to each other in parallel.

12 Claims, 17 Drawing Sheets

(51) Int. Cl.
*H01L 31/18* (2006.01)
*E04D 1/30* (2006.01)
*H01L 31/02* (2006.01)

(52) U.S. Cl.
CPC ...... *H01L 31/0488* (2013.01); *H01L 31/1876* (2013.01); *E04D 2001/308* (2013.01)

(58) Field of Classification Search
CPC . H01L 31/0504; E04D 1/30; E04D 2001/308; E04D 1/265; E04D 1/16
See application file for complete search history.

(56) References Cited

U.S. PATENT DOCUMENTS

| | | | |
|---|---|---|---|
| 3,369,939 A * | 2/1968 | Myer | H01L 31/00 136/246 |
| 3,459,391 A | 8/1969 | Haynos | |
| 3,461,602 A | 8/1969 | Heinz | |
| 4,040,867 A * | 8/1977 | Forestieri | H01L 31/048 136/244 |
| 4,239,810 A | 12/1980 | Alameddine | |
| 4,336,413 A | 6/1982 | Tourneux | |
| 4,400,577 A | 8/1983 | Spear | |
| 4,623,753 A | 11/1986 | Feldman et al. | |
| 4,724,011 A | 2/1988 | Turner | |
| 4,946,512 A | 8/1990 | Fukuroi et al. | |
| 5,112,408 A | 5/1992 | Melchior | |
| 5,118,540 A | 6/1992 | Hutchison | |
| 5,316,592 A | 5/1994 | Dinwoodie | |
| 5,338,369 A | 8/1994 | Rawlings | |
| 5,427,961 A | 6/1995 | Takenouchi | |
| 5,437,735 A | 8/1995 | Younan et al. | |
| 5,482,569 A | 1/1996 | Ihara et al. | |
| 5,571,338 A | 11/1996 | Kadonome et al. | |
| 5,575,861 A | 11/1996 | Younan et al. | |
| 5,590,495 A | 1/1997 | Bressler et al. | |
| 5,596,981 A | 1/1997 | Soucy | |
| 5,667,596 A | 9/1997 | Tsuzuki | |
| 5,701,067 A | 12/1997 | Kaji et al. | |
| 5,919,316 A | 7/1999 | Bogorad et al. | |
| 5,942,048 A | 8/1999 | Fujisaki | |
| 6,093,884 A | 7/2000 | Toyomura et al. | |
| 6,133,522 A | 10/2000 | Kataoka | |
| 6,186,698 B1 | 2/2001 | Knapp | |
| 6,307,144 B1 | 10/2001 | Mimura et al. | |
| 6,311,436 B1 | 11/2001 | Mimura | |
| 6,365,824 B1 | 4/2002 | Nakazima | |
| 6,465,724 B1 | 10/2002 | Garvison et al. | |
| 6,472,594 B1 | 10/2002 | Ichinose | |
| 6,515,216 B2 | 2/2003 | Zenko et al. | |
| 6,586,271 B2 | 7/2003 | Hanoka | |
| 6,620,645 B2 | 9/2003 | Chandra et al. | |
| 6,670,541 B2 | 12/2003 | Nagao et al. | |
| 6,672,018 B2 | 1/2004 | Shingleton | |
| 6,883,290 B2 | 4/2005 | Dinwoodie | |
| 6,959,520 B2 | 11/2005 | Hartman | |
| 6,960,716 B2 | 11/2005 | Matsumi | |
| 7,012,188 B2 | 3/2006 | Erling | |
| 7,259,321 B2 | 8/2007 | Oswald | |
| 7,276,724 B2 | 10/2007 | Sheats | |
| 7,328,534 B2 | 2/2008 | Dinwoodie | |
| 7,506,477 B2 | 3/2009 | Flaherty | |
| 7,534,956 B2 | 5/2009 | Kataoka | |
| 7,772,484 B2 | 8/2010 | Li | |
| 7,833,808 B2 | 11/2010 | Xu | |
| 7,851,700 B2 | 12/2010 | Luch | |
| 7,858,874 B2 | 12/2010 | Ruskin | |
| 7,902,451 B2 | 3/2011 | Shimizu | |
| 7,964,440 B2 | 6/2011 | Salleo | |
| 8,109,048 B2 | 2/2012 | West et al. | |
| 8,141,306 B2 | 3/2012 | Masuda et al. | |
| 8,156,697 B2 | 4/2012 | Miros et al. | |
| 8,205,400 B2 | 6/2012 | Allen | |
| 8,206,664 B2 | 6/2012 | Lin | |
| 8,276,329 B2 | 10/2012 | Lenox | |
| 8,307,606 B1 | 11/2012 | Rego et al. | |
| 8,471,141 B2 | 6/2013 | Stancel | |
| 8,519,531 B2 | 8/2013 | Pilat et al. | |
| 8,601,754 B2 | 12/2013 | Jenkins et al. | |
| 8,664,030 B2 | 3/2014 | Luch | |
| 8,674,377 B2 | 3/2014 | Farquhar | |
| 8,697,981 B2 | 4/2014 | Adriani et al. | |
| 8,701,360 B2 | 4/2014 | Ressler | |
| 8,713,861 B2 | 5/2014 | Desloover | |
| 8,740,642 B2 | 6/2014 | Keenihan et al. | |
| 8,763,322 B2 | 7/2014 | Hamamura | |
| 8,822,810 B2 | 9/2014 | Luch | |
| 8,869,470 B2 | 10/2014 | Lanza | |
| 8,919,075 B2 | 12/2014 | Erickson | |
| 9,000,288 B2 * | 4/2015 | Hoang | H01L 31/022433 136/244 |
| 9,012,763 B2 | 4/2015 | Frolov et al. | |
| 9,038,330 B2 | 5/2015 | Bellavia | |
| 9,150,966 B2 | 10/2015 | Xu | |
| 9,206,520 B2 | 12/2015 | Barr | |
| 9,343,592 B2 | 5/2016 | Hunt | |
| 9,356,173 B2 | 5/2016 | Okandan et al. | |
| 9,362,527 B2 | 6/2016 | Takemura | |
| 9,412,884 B2 | 8/2016 | Heng | |
| 9,412,890 B1 | 8/2016 | Meyers | |
| 9,435,568 B2 | 9/2016 | Smidt et al. | |
| 9,496,423 B2 | 11/2016 | Loeckenhoff et al. | |
| 9,496,819 B2 | 11/2016 | Hsueh et al. | |
| 9,518,391 B2 | 12/2016 | Haynes et al. | |
| 9,525,092 B2 | 12/2016 | Mayer | |
| 9,673,750 B2 | 6/2017 | Schoop et al. | |
| 9,685,579 B2 | 6/2017 | Gonzalez et al. | |
| 9,825,582 B2 | 11/2017 | Fernandes | |
| 9,882,077 B2 | 1/2018 | Morad et al. | |
| 9,899,554 B2 | 2/2018 | Yang | |
| 9,954,480 B2 | 4/2018 | Haynes et al. | |
| 9,966,487 B2 | 5/2018 | Magnusdottir | |
| 10,056,522 B2 | 8/2018 | Gonzalez | |
| 10,145,116 B2 | 12/2018 | Holt et al. | |
| 10,151,114 B2 | 12/2018 | Stearns et al. | |
| 10,177,708 B2 | 1/2019 | Cruz | |
| 10,256,765 B2 | 4/2019 | Rodrigues et al. | |
| 10,461,685 B2 | 10/2019 | Anderson et al. | |
| 10,563,406 B2 | 2/2020 | Kalkanoglu et al. | |
| 2001/0054435 A1 | 12/2001 | Nagao | |
| 2002/0015782 A1 | 2/2002 | Abys | |
| 2003/0010377 A1 | 1/2003 | Fukuda et al. | |
| 2003/0180983 A1 | 9/2003 | Oswald | |
| 2004/0261840 A1 | 12/2004 | Schmit | |
| 2005/0022857 A1 | 2/2005 | Daroczi et al. | |
| 2005/0039788 A1 | 2/2005 | Blieske | |
| 2005/0268963 A1 | 12/2005 | Jordan | |
| 2006/0048798 A1 | 3/2006 | McCoy | |
| 2006/0086620 A1 | 4/2006 | Chase | |
| 2006/0102380 A1 | 5/2006 | Hu | |
| 2006/0204730 A1 | 9/2006 | Nakamura | |
| 2007/0011898 A1 | 1/2007 | Frank et al. | |
| 2008/0053511 A1 | 3/2008 | Nakamura | |
| 2008/0135085 A1 | 6/2008 | Corrales | |
| 2008/0149170 A1 | 6/2008 | Hanoka | |
| 2008/0231768 A1 | 9/2008 | Okabe | |
| 2008/0271773 A1 | 11/2008 | Jacobs et al. | |
| 2008/0302030 A1 | 12/2008 | Stancel et al. | |
| 2009/0101192 A1 | 4/2009 | Kothari | |
| 2009/0120497 A1 | 5/2009 | Schetty | |
| 2009/0133739 A1 | 5/2009 | Shiao | |
| 2009/0133740 A1 | 5/2009 | Shiao | |
| 2009/0233083 A1 | 9/2009 | Inoue | |
| 2009/0242021 A1 | 10/2009 | Petkie | |
| 2009/0287446 A1 | 11/2009 | Wang | |
| 2009/0308435 A1 | 12/2009 | Caiger | |
| 2010/0000603 A1 | 1/2010 | Tsuzuki | |
| 2010/0006147 A1 | 1/2010 | Nakashima | |
| 2010/0018568 A1 | 1/2010 | Nakata | |
| 2010/0116330 A1 | 5/2010 | Inoue | |
| 2010/0132762 A1 | 6/2010 | Graham | |
| 2010/0147363 A1 | 6/2010 | Huang | |
| 2010/0147364 A1 | 6/2010 | Gonzalez et al. | |

(56) References Cited

U.S. PATENT DOCUMENTS

| | | |
|---|---|---|
| 2010/0180929 A1 | 7/2010 | Raymond |
| 2011/0017278 A1 | 1/2011 | Kalkanoglu et al. |
| 2011/0023937 A1 | 2/2011 | Daniel |
| 2011/0023942 A1 | 2/2011 | Soegding |
| 2011/0030761 A1 | 2/2011 | Kalkanoglu |
| 2011/0047902 A1 | 3/2011 | Cryar |
| 2011/0048507 A1 | 3/2011 | Livsey et al. |
| 2011/0100436 A1* | 5/2011 | Cleereman ............ H02S 20/23 136/251 |
| 2011/0203637 A1 | 8/2011 | Patton et al. |
| 2011/0253193 A1 | 10/2011 | Korman et al. |
| 2011/0277825 A1 | 11/2011 | Fu |
| 2011/0290307 A1 | 12/2011 | Workman et al. |
| 2012/0000502 A1 | 1/2012 | Wiedeman et al. |
| 2012/0012162 A1 | 1/2012 | Kobayashi |
| 2012/0031470 A1 | 2/2012 | Dimov |
| 2012/0048349 A1 | 3/2012 | Metin |
| 2012/0060911 A1 | 3/2012 | Fu |
| 2012/0125391 A1 | 5/2012 | Pinarbasi |
| 2012/0199184 A1 | 8/2012 | Nie |
| 2012/0204927 A1 | 8/2012 | Peterson et al. |
| 2012/0237670 A1 | 9/2012 | Lim |
| 2013/0048062 A1 | 2/2013 | Min |
| 2013/0061913 A1 | 3/2013 | Willham |
| 2013/0098420 A1 | 4/2013 | Sherman et al. |
| 2013/0160823 A1 | 6/2013 | Khouri |
| 2013/0206213 A1 | 8/2013 | He |
| 2013/0209776 A1 | 8/2013 | Kim |
| 2013/0233378 A1 | 9/2013 | Moslehi |
| 2013/0239495 A1 | 9/2013 | Galitev et al. |
| 2013/0247959 A1 | 9/2013 | Kwon |
| 2013/0255755 A1 | 10/2013 | Chich |
| 2013/0280521 A1 | 10/2013 | Mori |
| 2013/0284241 A1* | 10/2013 | Georgi .............. H01L 31/0488 136/251 |
| 2014/0120699 A1 | 5/2014 | Hua |
| 2014/0124014 A1 | 5/2014 | Morad |
| 2014/0196768 A1 | 7/2014 | Heng et al. |
| 2014/0246549 A1 | 9/2014 | West et al. |
| 2014/0313574 A1 | 10/2014 | Bills |
| 2014/0360582 A1 | 12/2014 | Cui |
| 2015/0068582 A1 | 3/2015 | Chaney |
| 2015/0083191 A1 | 3/2015 | Gmundner |
| 2015/0090314 A1 | 4/2015 | Yang |
| 2015/0155824 A1 | 6/2015 | Chien |
| 2015/0194552 A1 | 7/2015 | Ogasahara |
| 2015/0243931 A1 | 8/2015 | Fukuura |
| 2015/0270410 A1 | 9/2015 | Heng |
| 2015/0349145 A1 | 12/2015 | Morad |
| 2015/0349152 A1 | 12/2015 | Voss |
| 2015/0349703 A1 | 12/2015 | Morad |
| 2016/0013329 A1 | 1/2016 | Brophy |
| 2016/0105144 A1 | 4/2016 | Haynes |
| 2016/0163902 A1 | 6/2016 | Podlowski |
| 2016/0181446 A1 | 6/2016 | Kalkanoglu |
| 2016/0225931 A1 | 8/2016 | Heng |
| 2017/0033250 A1 | 2/2017 | Ballif |
| 2017/0077343 A1 | 3/2017 | Morad |
| 2017/0194516 A1 | 7/2017 | Reddy |
| 2017/0194900 A1* | 7/2017 | Erben .................... H02S 40/34 |
| 2017/0222082 A1 | 8/2017 | Lin |
| 2017/0358699 A1 | 12/2017 | Juliano et al. |
| 2018/0054157 A1 | 2/2018 | Kapla et al. |
| 2018/0166601 A1 | 6/2018 | Inaba |
| 2018/0254738 A1 | 9/2018 | Yang et al. |
| 2018/0316302 A1 | 11/2018 | Okawa et al. |
| 2018/0351501 A1 | 12/2018 | Seery et al. |
| 2018/0351502 A1 | 12/2018 | Almy et al. |
| 2019/0028055 A1 | 1/2019 | Yang et al. |
| 2019/0260328 A1 | 8/2019 | Nguyen et al. |
| 2019/0393361 A1* | 12/2019 | Lin .................... H01L 31/0201 |
| 2020/0044599 A1 | 2/2020 | Nguyen et al. |
| 2021/0091712 A1 | 3/2021 | Nguyen et al. |

FOREIGN PATENT DOCUMENTS

| | | | |
|---|---|---|---|
| CN | 102956730 | 6/2016 | |
| CN | 206401337 U | 8/2017 | |
| CN | 206595269 U | 10/2017 | |
| DE | 102007054124 | 5/2009 | |
| EP | 0828036 A2 | 3/1998 | |
| EP | 1058320 | 12/2000 | |
| EP | 1362967 A1 | 11/2003 | |
| EP | 1485547 A1 | 12/2004 | |
| EP | 2051124 A2 | 4/2009 | |
| EP | 2243901 A2 | 10/2010 | |
| EP | 2362429 A2 * | 8/2011 | ............ F24S 25/61 |
| EP | 2709160 | 3/2014 | |
| EP | 2784241 A1 | 10/2014 | |
| EP | 2950018 A1 | 12/2015 | |
| GB | 2278618 | 12/1994 | |
| GB | 2497276 A | 6/2013 | |
| JP | S57141979 | 9/1982 | |
| JP | S6020586 | 2/1985 | |
| JP | H06140657 | 5/1994 | |
| JP | H06264571 | 9/1994 | |
| JP | 10-46769 A | 2/1998 | |
| JP | 2000-58894 A | 2/2000 | |
| JP | 2000091610 | 3/2000 | |
| JP | 2000216415 | 8/2000 | |
| JP | 2001-12038 A | 1/2001 | |
| JP | 2001-15788 A | 1/2001 | |
| JP | 2006-144267 A | 6/2006 | |
| JP | 2013211385 | 10/2013 | |
| JP | 2014-22702 A | 2/2014 | |
| JP | 2017-517145 A | 6/2017 | |
| KR | 10-0276185 B1 | 12/2000 | |
| KR | 10-1162675 B1 | 7/2012 | |
| WO | 2003/074812 A1 | 9/2003 | |
| WO | 2008136872 | 11/2008 | |
| WO | 2009062106 | 5/2009 | |
| WO | 2009099418 | 8/2009 | |
| WO | 2009/137347 A2 | 11/2009 | |
| WO | 2010128375 | 11/2010 | |
| WO | 2011128757 | 10/2011 | |
| WO | 201359441 | 4/2013 | |
| WO | 2013067541 | 5/2013 | |
| WO | 2013102181 | 7/2013 | |
| WO | 2014178180 | 11/2014 | |
| WO | 2015155356 | 10/2015 | |
| WO | 2016/024310 A1 | 2/2016 | |
| WO | 2016090341 | 6/2016 | |

OTHER PUBLICATIONS

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

Pelisset: "Efficiency of Silicon Thin-Film photovoltaic Modules with a Front Coloured Glass", Proceedings CISBAT 2011, Jan. 1, 2011, pp. 37-42, XP055049695, the Whole Document.

Non-Final Office Action received for U.S. Appl. No. 15/686,109, dated Nov. 25, 2020, 11 pages.

Notice of Allowance received for U.S. Appl. No. 15/686,064, dated Dec. 30, 2020, 8 pages.

Advisory Action received for U.S. Appl. No. 15/686,109, dated Jun. 16, 2020, 3 pages.

Final Office Action received for U.S. Appl. No. 15/909,181, dated Dec. 20, 2018, 23 pages.

Final Office Action received for U.S. Appl. No. 15/656,794, dated Jul. 29, 2019, 19 pages.

Final Office Action received for U.S. Appl. No. 15/686,109, dated Dec. 12, 2019, 10 pages.

Final Office Action received for U.S. Appl. No. 15/686,064, dated Jul. 28, 2020, 13 pages.

(56) References Cited

OTHER PUBLICATIONS

International Preliminary Report on Patentability received for PCT Patent Application No. PCT/US2018/020508, dated Sep. 10, 2020, 10 pages.
International Preliminary Report on Patentability received for PCT Patent Application No. PCT/US2018/035918, dated Dec. 19, 2019, 11 pages.
International Preliminary Report on Patentability received for PCT Patent Application No. PCT/US2018/035924, dated Dec. 19, 2019, 8 pages.
International Preliminary Report on Patentability received for PCT Patent Application No. PCT/US2018/042418, dated Jan. 30, 2020, 12 pages.
International Search Report and Opinion received for PCT Patent Application No. PCT/US2018/035918, dated Nov. 6, 2018, 15 pages.
International Search Report and Written Opinion received for PCT Patent Application No. PCT/US2018/020508, dated Mar. 4, 2019, 14 pages.
International Search Report and Written Opinion received for PCT Patent Application No. PCT/US2018/035924, dated Sep. 12, 2018, 10 pages.
International Search Report and Written Opinion received for PCT Patent Application No. PCT/US2018/042418, dated Nov. 28, 2018, 14 pages.
International Search Report and Written Opinion received for PCT Patent Application No. PCT/US2019/044308, dated Oct. 14, 2019, 9 pages.
Invitation to Pay Additional Fee received for PCT Patent Application No. PCT/US2018/035918, mailed on Sep. 12, 2018, 11 pages.
Invitation to Pay Additional Fees received for PCT Patent Application No. PCT/US2018/020508, mailed on Jan. 9, 2019, 9 pages.
Non-Final Office Action received for U.S. Appl. No. 15/686,064, dated Nov. 29, 2019, 13 pages.
Non-Final Office Action received for U.S. Appl. No. 15/900,636, dated Jan. 28, 2020, 16 pages.
Non-Final Office Action received for U.S. Appl. No. 16/050,994, dated Sep. 23, 2020, 11 pages.
Notice of Allowance received for U.S. Appl. No. 15/656,794, dated Mar. 27, 2020, 10 pages.
Notice of Allowance received for U.S. Appl. No. 15/900,636, dated Aug. 6, 2020, 10 pages.
Notice of Allowance received for U.S. Appl. No. 15/909,181, dated Sep. 10, 2019, 11 pages.
Office Action received for Australian Patent Application No. 2018410566, dated Jul. 9, 2020, 9 pages.
Office Action received for European Patent Application No. 18711759.3, dated Sep. 24, 2020, 4 pages.
Pre-Interview First Office Action received for U.S. Appl. No. 15/656,794, dated Apr. 16, 2019, 5 pages.
Pre-Interview First Office Action received for U.S. Appl. No. 15/686,109, dated May 24, 2019, 10 pages.
Pre-Interview First Office Action received for U.S. Appl. No. 15/909,181, dated Sep. 18, 2018, 6 pages.
Decision to Grant received for European Patent Application No. 18711759.3, dated Jul. 1, 2021, 2 pages.
Final Office Action received for U.S. Appl. No. 15/686,109, dated Jun. 18, 2021, 9 pages.
Final Office Action received for U.S. Appl. No. 16/050,994, dated Mar. 26, 2021, 13 pages.
Intention to Grant received for European Patent Application No. 18711759.3, dated Feb. 18, 2021, 7 pages.
International Preliminary Report on Patentability received for PCT Patent Application No. PCT/US2019/044308, dated Feb. 11, 2021, 7 pages.
Non-Final Office Action received for U.S. Appl. No. 16/050,994, dated Jul. 9, 2021, 13 pages.
Notice of Acceptance received for Australian Patent Application No. 2018410566, dated Feb. 3, 2021, 3 pages.
Notice of Allowance received for U.S. Appl. No. 15/686,109, dated Sep. 29, 2021, 8 pages.
Office Action received for Canadian Patent Application No. 3,066,407, dated Jan. 29, 2021, 3 pages.
Office Action received for Canadian Patent Application No. 3,066,410, dated Feb. 9, 2021, 4 pages.
Office Action received for Canadian Patent Application No. 3,066,410, dated May 6, 2021, 3 pages.
Office Action received for Canadian Patent Application No. 3055609, dated Aug. 18, 2021, 5 pages.
Office Action received for European Patent Application No. 18733485.9, dated Mar. 11, 2021, 5 pages.
Office Action received for European Patent Application No. 18733486.7, dated Mar. 12, 2021, 3 pages.
Office Action received for Indian Patent Application No. 201947052632, dated Mar. 31, 2021, 5 pages.
Office Action received for Japanese Patent Application No. 2019-547652, dated Aug. 18, 2021, 10 pages (4 pages of English Translation and 6 pages of Official copy).
Office Action received for Korean Patent Application No. 10-2020-7000127, dated Mar. 22, 2021, 10 pages (4 pages of English Translation and 6 pages of Official copy).
Office Action received for Korean Patent Application No. 10-2020-7000130, dated Mar. 24, 2021, 10 pages (3 pages of English Translation and 7 pages of Official copy).

* cited by examiner

SOLAR ROOF TILE MODULE

BACKGROUND

Field

This disclosure is generally related to photovoltaic (or "PV") roof tile modules. More specifically, this disclosure is related to photovoltaic roof modules with improved aesthetic and power efficiency.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically encloses fewer solar cells than a conventional solar panel.

The front and back covers can be fortified glass or other material that can protect the PV cells from the weather elements. Note that a typical roof tile may have a dimension of 15 in×8 in =120 in$^2$=774 cm$^2$, and a typical solar cell may have a dimension of 6 in×6 in =36 in$^2$=232 cm$^2$. Similar to a conventional PV panel, the PV roof tile can include an encapsulating layer, such as an organic polymer. A lamination process can seal the solar cells between the front and back covers.

The arrangement of PV cells encapsulated within each PV roof tile can determine not only the size and shape of the PV roof tile but also its power efficiency. Moreover, to facilitate scalable production and easy installation of PV roof tiles, a group of tiles can be fabricated together as a single module. The arrangement of the tiles within the module can also determine the power efficiency of the module.

SUMMARY

One embodiment can provide a photovoltaic roof tile module. The photovoltaic roof tile module can include at least: a first photovoltaic roof tile and a second photovoltaic roof tile positioned adjacent to each other, and a spacer coupled to and positioned between the first and second photovoltaic roof tiles. A respective photovoltaic roof tile can include front and back glass covers, and multiple cascaded strings encapsulated between the front and back glass covers. A respective cascaded string can include a plurality of photovoltaic structures electrically coupled to each other in series, and the multiple cascaded strings can be electrically coupled to each other in parallel. The first and second photovoltaic roof tiles can be electrically coupled to each other in parallel.

In a variation on this embodiment, a respective photovoltaic structure can include a first edge busbar positioned near an edge of a first surface and a second edge busbar positioned near an opposite edge of a second surface. The plurality of photovoltaic structures can be arranged in such a way that the first edge busbar of a first photovoltaic structure overlaps the second edge busbar of an adjacent photovoltaic structure.

In a further variation, the multiple cascaded strings can be arranged in such a way that an edge busbar of a first cascaded string and a corresponding edge busbar of a second cascaded string are substantially aligned in a straight line.

In a further variation, the photovoltaic roof tile module can further include a metallic strip coupled to the corresponding edge busbars of the first and second cascaded strings to enable in-parallel coupling between the first and second cascaded strings.

In a further variation, a front-facing edge busbar of a respective cascaded string can be coupled to a bridge electrode.

In a variation on this embodiment, the back glass cover can include a glass substrate and a pre-laid circuit attached to the glass substrate.

In a further variation, the spacer can include an embedded circuit configured to couple to pre-laid circuits of the first and second photovoltaic roof tiles.

In a variation on this embodiment, each of the first and second photovoltaic roof tiles is oriented in a portrait fashion, and the first and second photovoltaic roof tiles are placed in such a way that a longer edge of the first photovoltaic roof tile is adjacent to a corresponding longer edge of the second photovoltaic roof tile.

One embodiment can provide a photovoltaic roof tile. The photovoltaic roof tile can include front and back glass covers, and multiple cascaded strings encapsulated between the front and back glass covers. A respective cascaded string can include a plurality of photovoltaic structures electrically coupled to each other in series, and the multiple cascaded strings can be electrically coupled to each other in parallel.

One embodiment can provide a method for fabricating a photovoltaic roof tile. The method can include preparing first and second back covers and obtaining multiple cascaded strings. A respective cascaded string can include a plurality of photovoltaic structures electrically coupled to each other in series. The method can further include encapsulating the multiple cascaded strings and a circuit between the first and second back covers. The circuit can facilitate in-parallel electrical coupling between the multiple cascaded strings.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same as or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a "string."

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the invention solve at least the technical problem of improving the aesthetics and efficiency of photovoltaic roof tile modules. More specifically, each roof tile can include multiple sets of photovoltaic strips arranged in a portrait fashion, with one set of photovoltaic strips positioned on top of the other neighboring set of photovoltaic strips. Photovoltaic strips within each set are arranged in a shingling fashion with adjacent edges of neighboring strips overlapping each other. These shingled photovoltaic strips are electrically coupled to each other in series. On the other hand, different sets of photovoltaic structures are coupled to each other in parallel. Moreover, multiple photovoltaic roof tiles can be assembled into a module. In some embodiments, the roof tiles are arranged in a lateral fashion. The multiple photovoltaic roof tiles can be electrically coupled to each other in parallel. The portrait layout of the roof tiles can provide better aesthetics than roof tiles with landscape layout. Moreover, the parallel coupling between the different sets of photovoltaic strips within each tile can reduce the internal resistance of each tile, thus improving power efficiency.

PV Roof Tiles and Multi-Tile Modules

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

Figure 1:
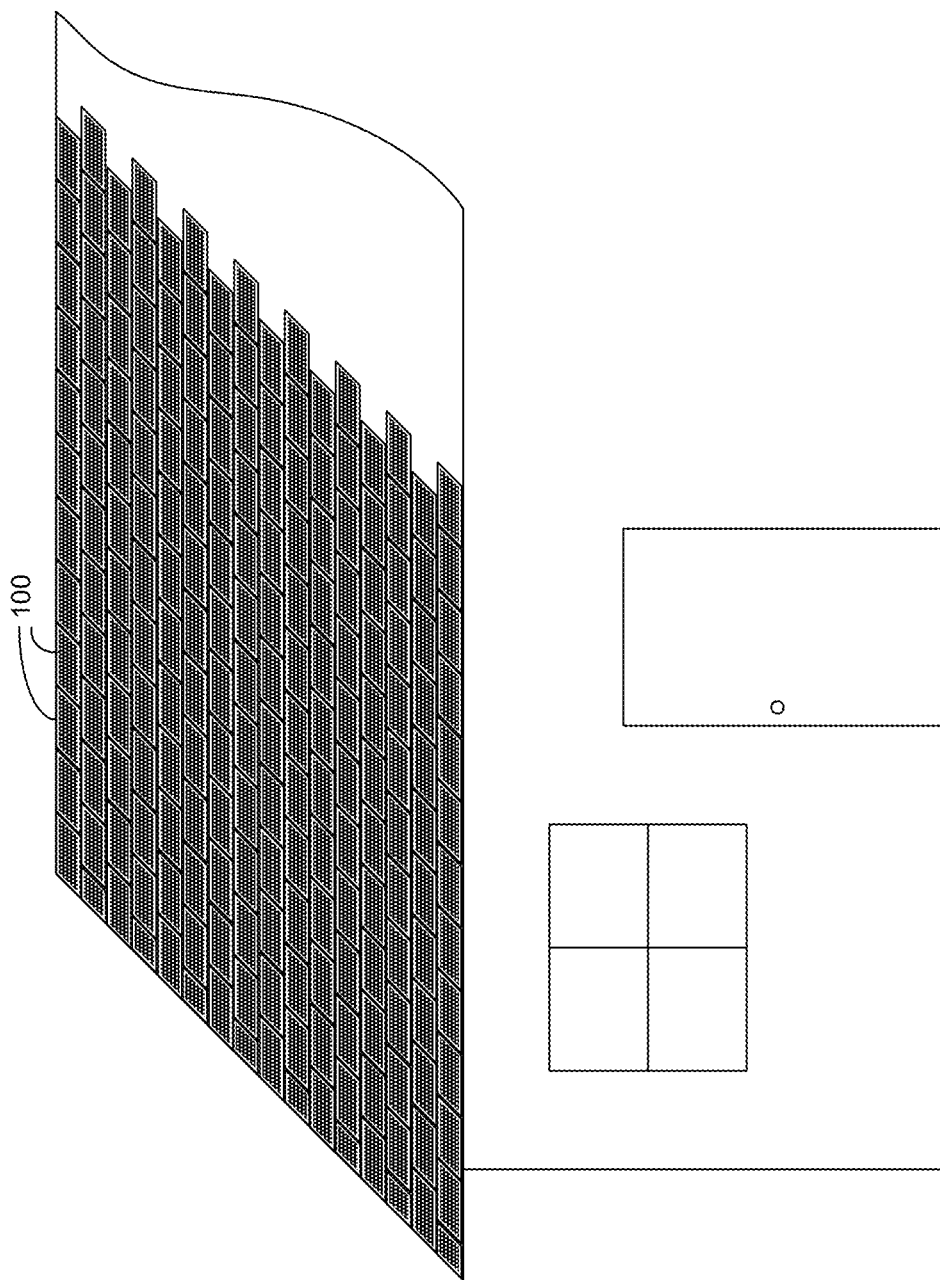
FIG. 1 shows an exemplary configuration of PV roof tiles on a house.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes, such as busbars and finger lines. The PV structures within a PV roof tile can be electrically and, optionally, mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
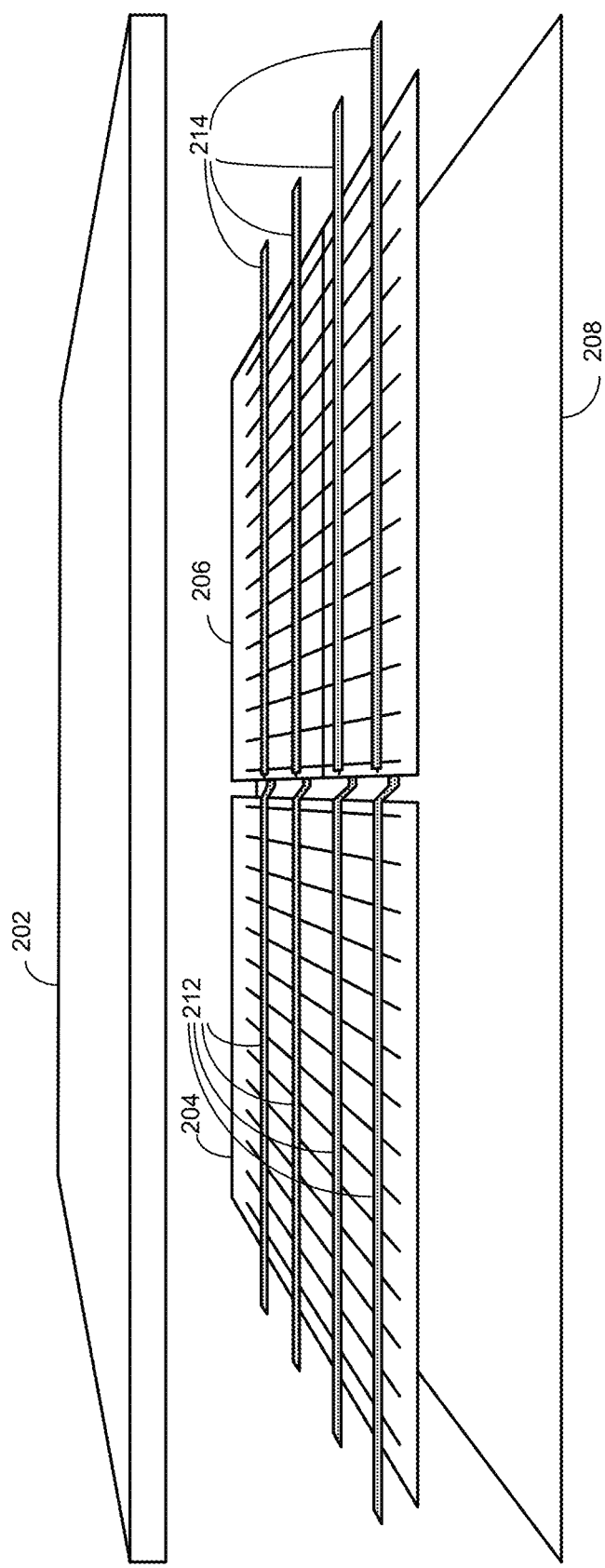
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 3:
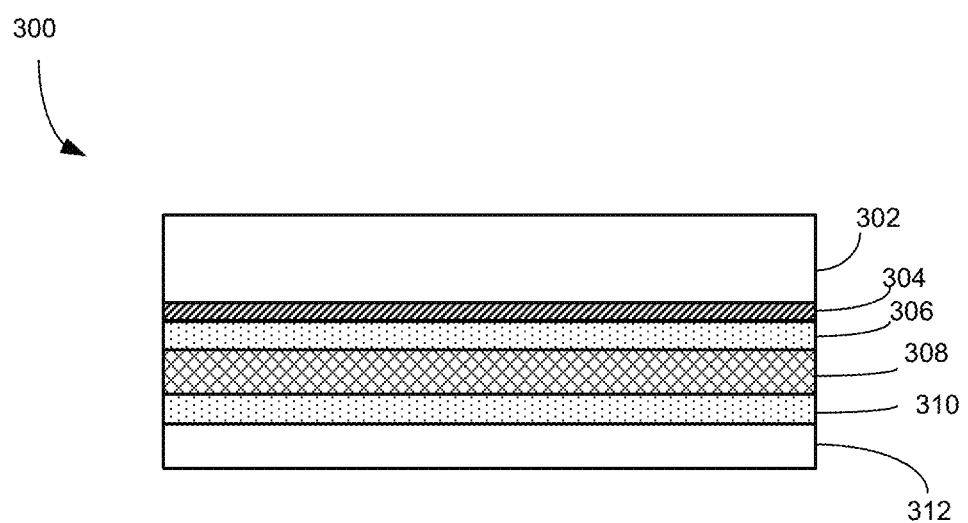
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

Figure 4A:
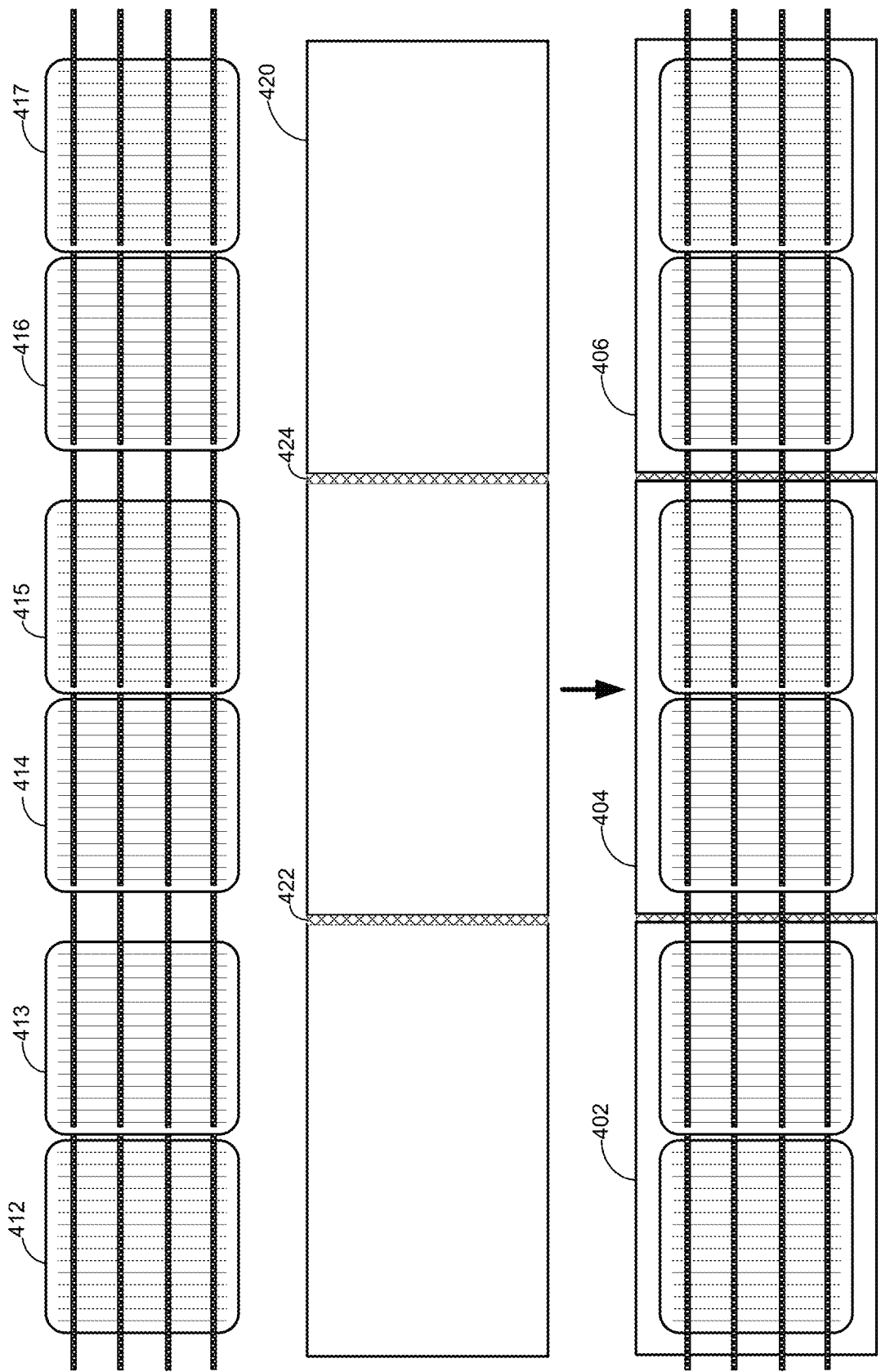
FIG. 4A illustrates an exemplary configuration of a multi-tile module, according to one embodiment.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the number of tiles included in each multi-tile module can be more or fewer than what is shown in FIG. 4A.

Figure 4B:
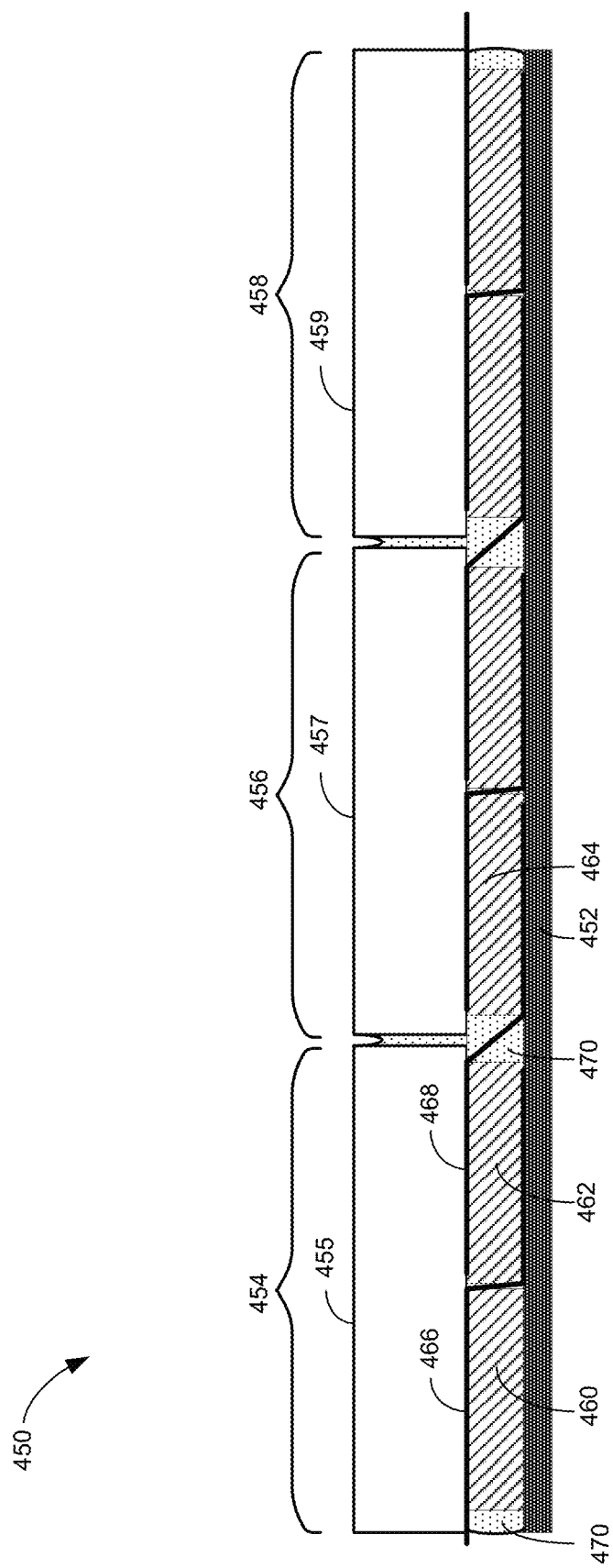
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 466 can couple the front electrode of solar cell 460 to the back electrode of solar cell 462, creating a serial connection between these two cells. Similarly, tabbing strip 468 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 468 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 5A:
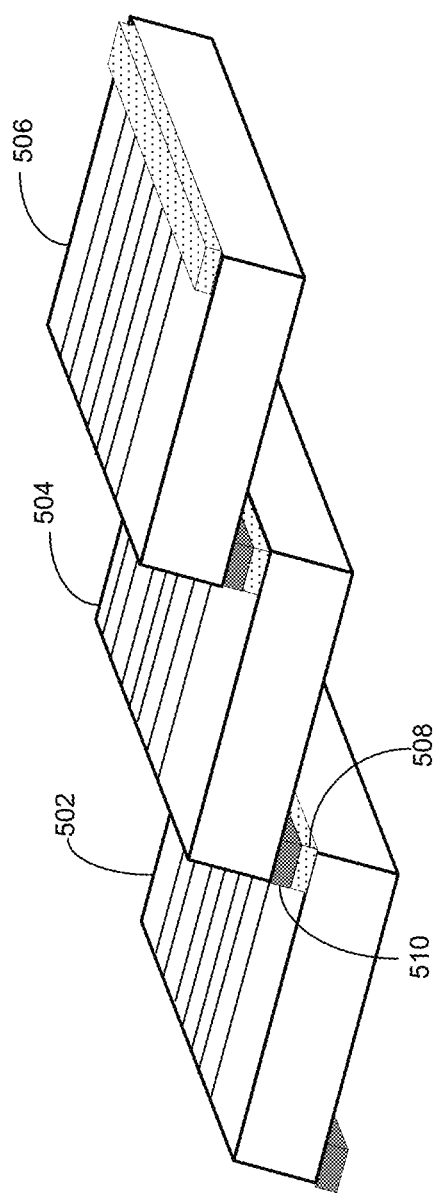
FIG. 5A illustrates a serial connection among three adjacent cascaded photovoltaic strips, according to one embodiment.

FIG. 5A illustrates a serial connection among three adjacent cascaded photovoltaic strips, according to one embodiment. In FIG. 5A, strips 502, 504, and 506 are stacked in such a way that strip 504 partially underlaps adjacent strip 506 to its right, and overlaps strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

Figure 5B:
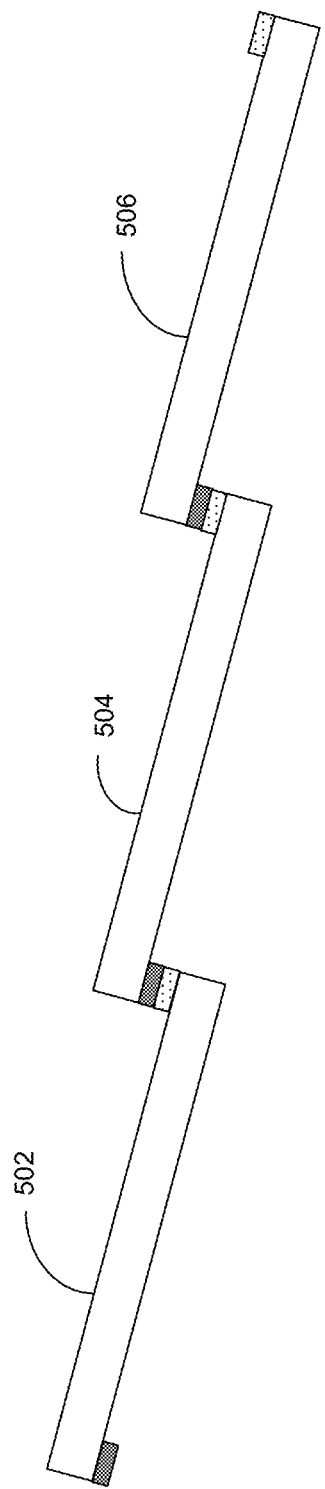
FIG. 5B illustrates the side view of the string of cascaded strips, according to one embodiment.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a serially connected string, and a number of strings can be coupled in series or parallel.

Figure 5C:
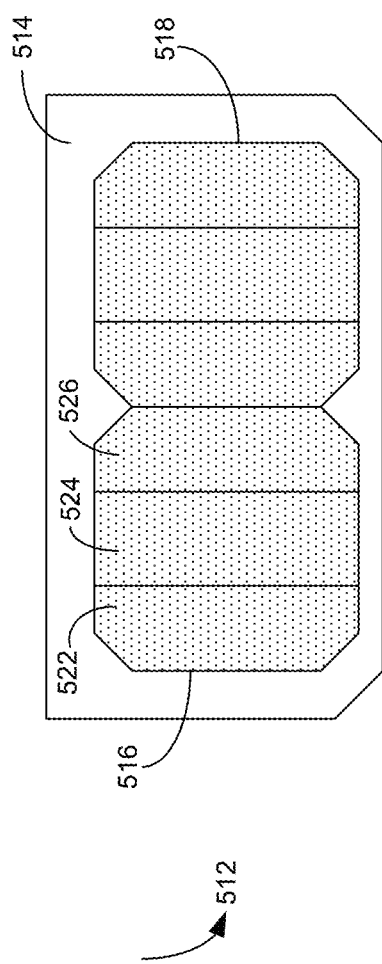
FIG. 5C illustrates an exemplary solar roof tile, according to one embodiment.

FIG. 5C illustrates an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

In the example shown in FIG. 5C, the photovoltaic strips encapsulated within each tile form a single cascaded string, meaning that they are electrically coupled to each other in series. Also, in this example each photovoltaic strip is obtained by dividing a traditional square or pseudo-square solar cell (also referred to as a standard solar cell) into three smaller pieces. Note that a standard solar cell can be 5 inches by 5 inches or 6 inches by 6 inches. The in-series coupling means that the current provided by each tile is ⅓ of the electrical current provided by the standard solar cell, whereas the voltage provided by each tile is 6 times the voltage provided by the standard solar cell.

Although dividing a standard cell into smaller pieces can reduce the internal resistance of each piece due to shortened finger lines, arranging multiple strips into a single long cascaded string also creates the problem of the long distance between the two polarities of the cascaded string. As one can see from FIG. 5C, one polarity of the cascaded string is located at one edge of the string and the opposite polarity of the cascaded string is located at the opposite edge of the string. As a result, an electrical coupling between one solar roof tile and another adjacent solar roof tile may require a connecting wire that runs through the entire length of the cascaded string. Such a long connecting wire can lead to increased internal resistance and reduced power efficiency.

To reduce the internal resistance of a photovoltaic roof tile, in some embodiments, instead of forming a single cascaded string, multiple cascaded strings can be formed within each photovoltaic roof tile, and an in-parallel coupling can be established among the multiple cascaded strings. For example, photovoltaic strips to be encapsulated within a photovoltaic roof tile can be divided into two sets, and each set of photovoltaic strips can form a cascaded string. The resulting two cascaded strings can then be coupled to each other in parallel. In some embodiments, the two cascaded strings can be arranged vertically in a portrait fashion, with one cascaded string positioned on top of the other.

Figure 6B:
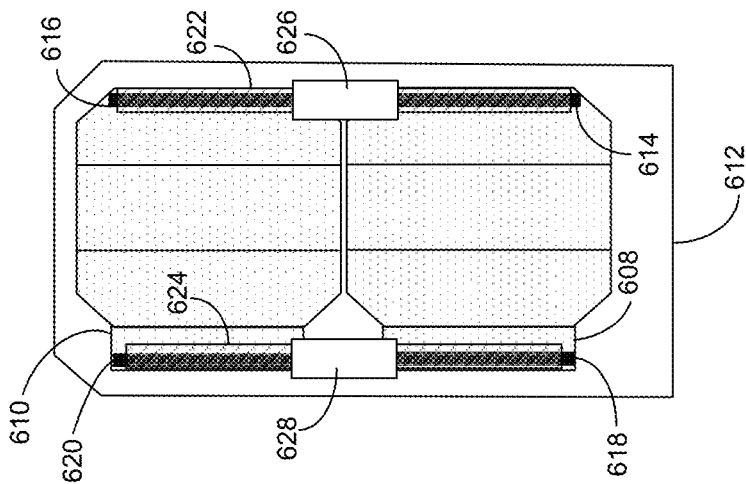
FIG. 6B shows the bottom view of the photovoltaic roof tile, according to one embodiment.
Figure 6A:
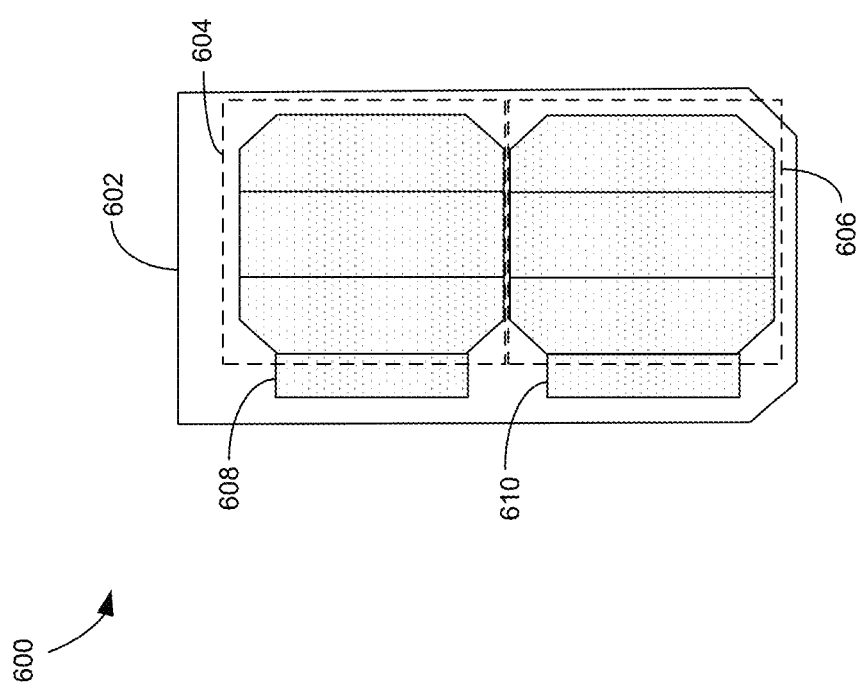
FIG. 6A illustrates the top view of an exemplary photovoltaic roof tile, according to one embodiment.

FIG. 6A illustrates the top view of an exemplary photovoltaic roof tile, according to one embodiment. Photovoltaic roof tile 600 can include a top glass cover 602 and photovoltaic strip sets 604 and 606. Each set of photovoltaic strips can include three photovoltaic strips arranged in a way similar to what's shown in FIGS. 5A-5B. In other words, each set of photovoltaic strips forms a cascaded string. FIG. 6A also shows that one end of each cascaded string can be coupled to a bridge electrode, which can be configured to convert a front-facing electrical contact of the cascaded string to a back-facing electrical contact to provide simple and concealed electrical contacts for the cascaded string. More specifically, the bridge electrode is coupled to the end of the cascaded string that has an edge busbar positioned on the front side (i.e., sun-facing side). For example, bridge electrode 608 can be coupled to an edge of the cascaded string formed by photovoltaic strip set 604, and bridge electrode 610 can be coupled to an edge of the cascaded string formed by photovoltaic strip set 606.

In some embodiments, a bridge electrode can include a Si substrate and a metallic layer deposited on the back side of the Si substrate. An edge of the bridge electrode can overlap the top edge busbar of the cascaded string, and the other edge of the bridge electrode can serve as a back side electrical contact for the cascaded string. In addition to a metallic layer that can cover the entire back surface of the Si substrate, additional busbar structures can also be formed on one or both edges of the bridge electrode to simulate the edge busbar of a photovoltaic strip. Detailed descriptions of the Si-based bridge electrode can be found in U.S. patent application Ser. No. 16/006,645, filed Jun. 12, 2018, and entitled "SOLAR ROOF TILE CONNECTORS," the disclosure of which is incorporated herein by reference in its entirety. In alternative embodiments, bridge electrodes 608 and 610 can include simple metal tabs coupled to the front edge busbar of each cascaded string.

Photovoltaic strip sets 604 and 606 are arranged into a portrait configuration, with photovoltaic strip set 604 positioned above photovoltaic strip set 606. More specifically, in FIG. 6A, the photovoltaic strips within each tile extend in the lateral (e.g., left and right) direction, whereas the two photovoltaic strip sets extend in the vertical (e.g., up and down) direction. This can result in photovoltaic tile 600 having a portrait orientation, with the height of photovoltaic roof tile 600 being larger than its width.

FIG. 6B shows the bottom view of the photovoltaic roof tile, according to one embodiment. For purposes of illustration, in FIG. 6B, back cover 612 is shown as transparent to reveal the back side of the cascaded strings, although in reality, back cover 612 may be opaque. FIG. 6B shows that each of the cascaded strings can include a back-side edge busbar, such as back-side edge busbars 614 and 616. FIG. 6B also shows that each of the bridge electrodes can include a back-side edge busbar. For example, bridge electrode 608 can include a back-side edge busbar 618, and bridge electrode 610 can include back-side edge busbar 620. Note that the back-side edge busbar of a cascaded string and the back-side edge busbar of the bridge electrode coupled to the cascaded string form the positive and negative electrodes of the cascaded string.

To facilitate in-parallel coupling between the two cascaded strings, in some embodiments, metallic strips that couple the corresponding electrodes can be used. For example, metallic strip 622 can be placed on top of back-side edge busbars 614 and 616, electrically coupling them to each other. Similarly, metallic strip 624 can be placed on top of back-side edge busbars 618 and 620, electrically coupling them to each other. In other words, metallic strips 622 and 624 can each couple electrodes of the same polarity of the cascaded strings. Note that the electrical coupling between the metallic strip and the back-side edge busbars can be achieved via direct metal-to-metal contact or by applying a conductive adhesive in between. Note that, to prevent current leakage, insulation tapes can be used to wrap around portions of the metallic strip that are not covered by the cascaded strings or bridge electrodes. For example, insulation tape 626 and 628 can be used to wrap around the exposed portions of metallic strips 622 and 624, respectively. Electrical coupling between different photovoltaic tiles is not shown in FIG. 6B.

Figure 7:
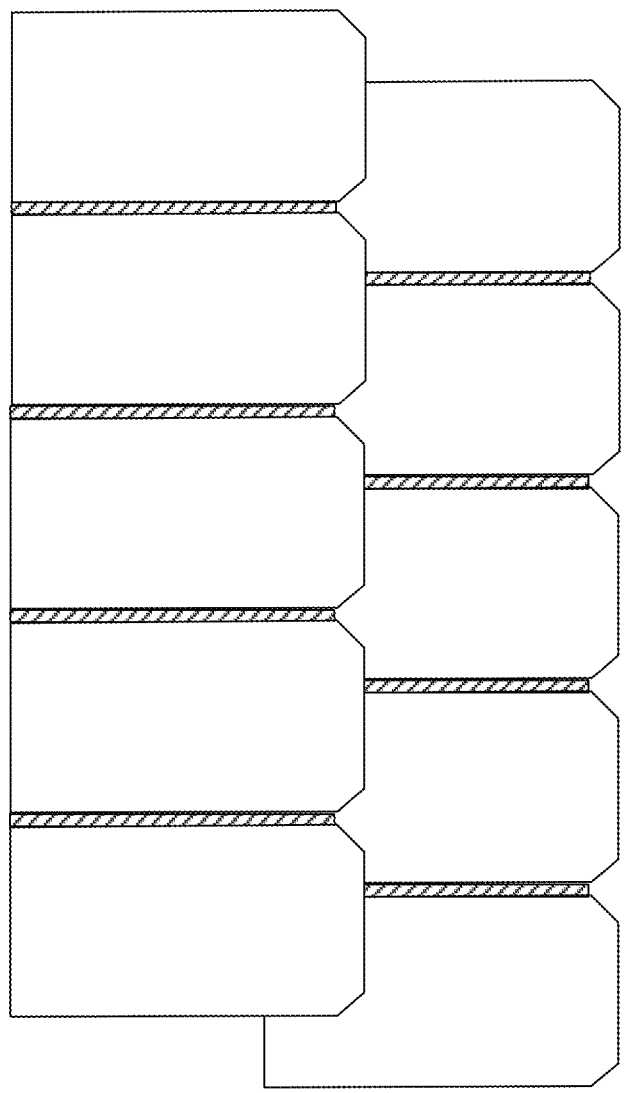
FIG. 7 shows exemplary solar roof tiles installed on a roof, according to one embodiment.

In most cases, photovoltaic roof tiles as shown in FIGS. 6A-6B can be installed on a roof in a portrait orientation, as shown in FIG. 7. Because many types of conventional roof tiles have a portrait orientation, the roof shown in FIG. 7 can be considered by most as providing better aesthetics than a roof with tiles installed in the landscape orientation.

As discussed previously, multiple photovoltaic roof tiles can be pre-assembled to form a multi-tile module to facilitate easy installation of the roof, because they can be laid down as a single unit. The photovoltaic roof tiles within each multi-tile module not only are mechanically coupled to each other, but also are electrically coupled to each other. The arrangement of the photovoltaic roof tiles within each multi-tile module can affect the electrical coupling among them, and the electrical coupling among the photovoltaic roof tiles within each module can affect the power efficiency of the multi-tile module. In some embodiments, the multiple photovoltaic roof tiles within a tile module can be placed in a lateral configuration. In other words, they can be arranged side by side, as shown in FIG. 8.

Figure 8:
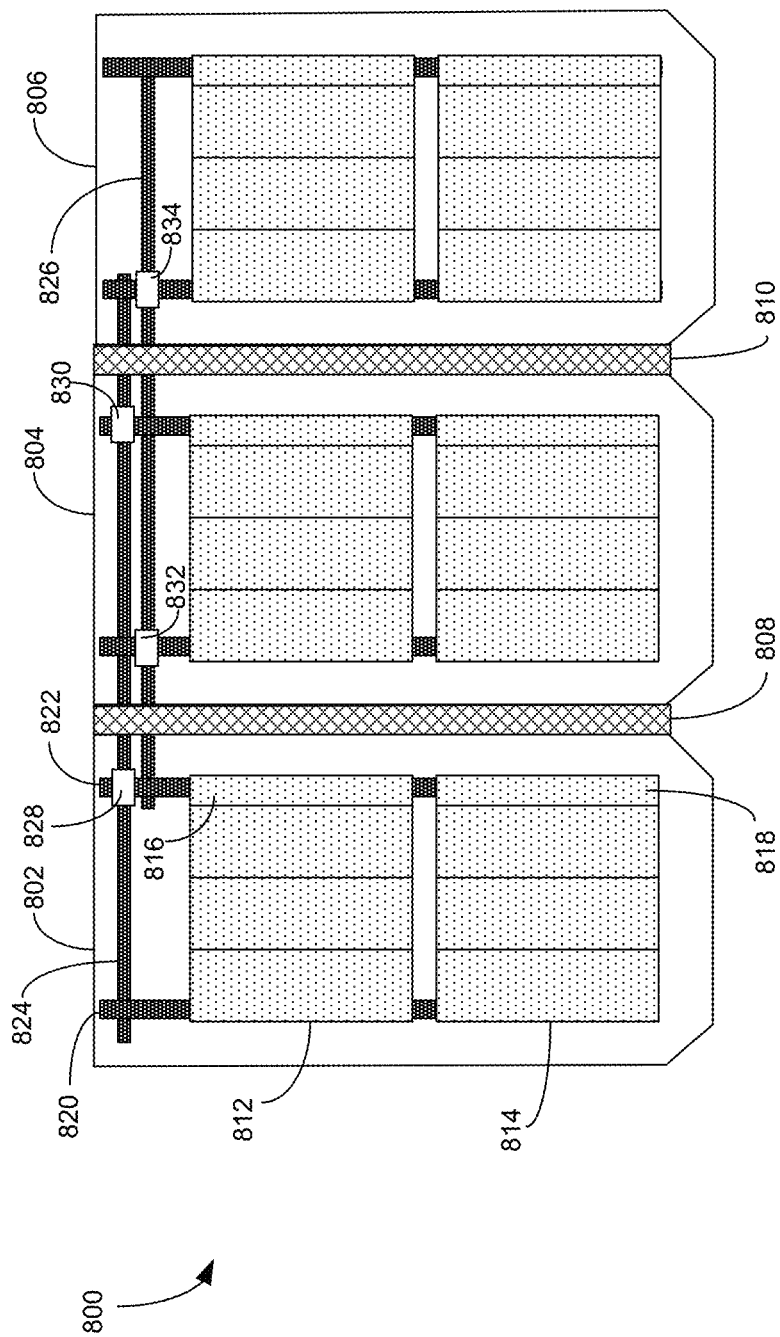
FIG. 8 shows a front view of an exemplary multi-tile module, according to one embodiment.

FIG. 8 shows a front view of an exemplary multi-tile module, according to one embodiment. Multi-tile module 800 can include a plurality of photovoltaic roof tiles (e.g., tiles 802, 804, and 806) that are coupled to each other by tile spacers. For example, tiles 802 and 804 are coupled to each other by tile spacer 808, and tiles 804 and 806 are coupled to each other by tile spacer 810. The multiple tiles are arranged side by side in such a way that a longer edge of a tile is placed adjacent to a corresponding longer edge of a neighboring tile.

Each tile can include at least two cascaded strings that form a vertical array. For example, tile 802 can include cascaded strings 812 and 814. Moreover, each cascaded string can be coupled to a bridge electrode for converting a front-side electrode to a back-side electrode. For example, cascaded string 812 is coupled to bridge electrode 816, and cascaded string 814 is coupled to bridge electrode 818.

As discussed previously, a pair of metallic strips can be used to achieve in-parallel electrical coupling between the cascaded strings. For example, vertically oriented metallic strips 820 and 822 each couple the electrodes of a particular polarity of the cascaded strings. More specifically, metallic strip 820 can electrically couple the back-side edge busbars of cascaded strings 812 and 814, and metallic strip 822 can couple the back-side edge busbars of bridge electrodes 816 and 818, which are coupled to the front-side edge busbars of cascaded strings 812 and 814, respectively.

In addition to electrical coupling within each photovoltaic roof tile, inter-tile electrical coupling among the photovoltaic tiles within a multi-tile module is also needed. In some embodiments, an additional pair of metallic strips (e.g., metallic strips 824 and 826) can be used to achieve the inter-tile electrical coupling. More specifically, each metallic strip can extend laterally along all three tiles to electrically couple the vertically oriented metallic strips, which in fact act as the two polarity electrodes of each tile. Depending on the desired type of electrical coupling (e.g., in-parallel or in-series), the coupling between the lateral and vertical metallic strips can be configured accordingly.

In the example shown in FIG. 8, in-parallel electrical coupling among the photovoltaic roof tiles is achieved. More specifically, lateral metallic strip 824 can be coupled to the vertical metallic strips of the first polarity of all photovoltaic roof tiles, whereas lateral metallic strip 826 can be coupled to the vertical metallic strips of the second polarity of all photovoltaic roof tiles. This can be achieved by coupling lateral metallic strip 824 to the vertical metallic strip (e.g., metallic strip 820) that is coupled to the back-side edge busbars of the cascaded strings and by coupling lateral metallic strip 826 to the vertical metallic strip (e.g., metallic strip 822) that is coupled to the back-side edge busbars of the bridge electrodes.

Note that, because each lateral metallic strip actually crosses vertical metallic strips of different polarities, appropriate insulation is needed. More specifically, insulation tapes 828 and 830 can be used to wrap portions of metallic strip 824, and insulation tapes 832 and 834 can be used to wrap portions of metallic strip 826, thus ensuring only desired electrical contacts are created. In addition to those regions where metallic strips cross, other portions of the metallic strips may require insulation to prevent current or voltage leakage. In fact, in some embodiments, each lateral metallic strip can be insulated in its entirety except at certain regions where metal-to-metal contacts are desired. Moreover, the vertical metallic strips may also be partially insulated (e.g., at regions not covered by the cascaded strings). For simplicity of illustration, not all insulated regions are marked in FIG. 8.

Figure 9:
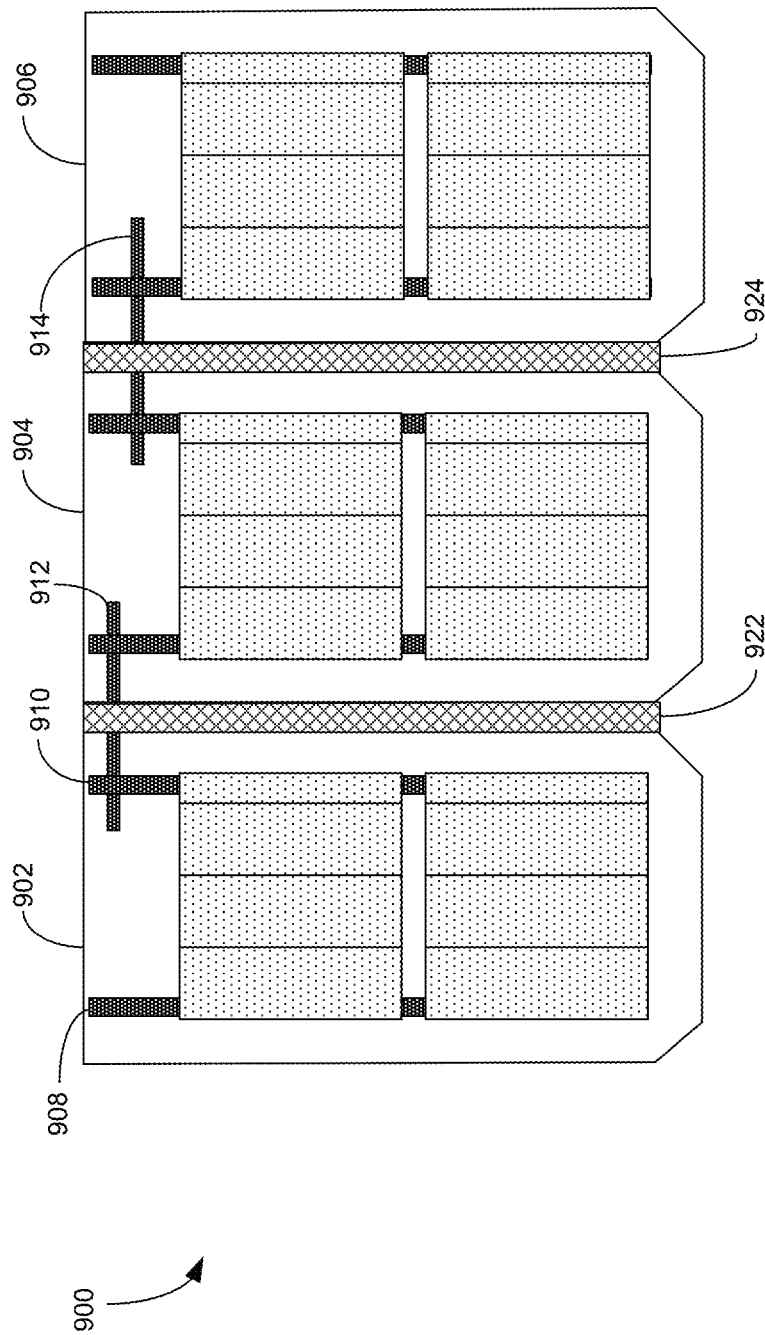
FIG. 9 shows a front view of an exemplary multi-tile module, according to one embodiment.

In addition to in-parallel electrical coupling, in-series electrical coupling among the photovoltaic roof tiles within a multi-tile module can also be achieved, as shown in FIG. 9. FIG. 9 shows a front view of an exemplary multi-tile module, according to one embodiment. In FIG. 9, multi-tile module 900 can include a number of photovoltaic roof tiles (e.g., photovoltaic roof tiles 902, 904, and 906) coupled to each other by tile spacers (e.g., tile spacers 922 and 924). Each photovoltaic roof tile can include a pair of vertically oriented metallic strips that serve as electrodes of opposite polarities. For example, photovoltaic roof tile 902 includes vertical metallic strips 908 and 910 that are coupled, respectively, to back-side edge busbars of the cascaded strings and back-side edge busbars of the bridge electrodes. A number of short metallic strips (e.g., metallic strips 912 and 914) can be used to couple selected vertical metallic strips in order to create the in-series coupling among the photovoltaic roof tiles. More specifically, a short metallic strip can couple the vertical metallic strip of a first polarity of a photovoltaic roof tile to the vertical metallic strip of a second polarity of an adjacent photovoltaic roof tile.

Figure 10:
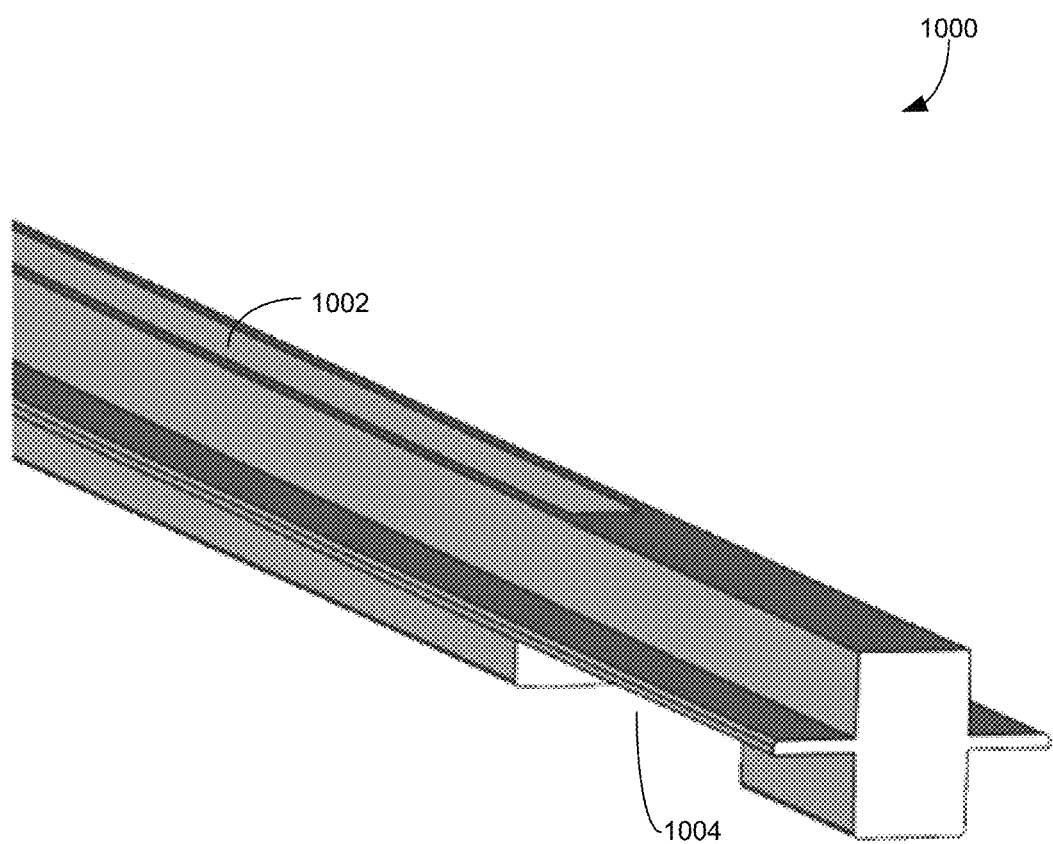
FIG. 10 shows the partial view of an exemplary tile spacer, according to one embodiment.

In FIGS. 8 and 9, metallic strips that extend laterally across multiple tiles are used to achieve the inter-tile electrical coupling. To extend from one photovoltaic roof tile to the adjacent one, the metallic strips need to thread through specially designed tile spacers. More specifically, a specially designed tile spacer can include a channel on its back side to allow the metallic strips to thread through. FIG. 10 shows the partial view of an exemplary tile spacer, according to one embodiment. Tile spacer 1000 can include a front-side groove 1002 and a back-side channel 1004. Front-side groove 1002 can create the visual appearance of a gap between adjacent photovoltaic roof tiles, and back-side channel 1004 can accommodate one or more metallic strips that pass through tile spacer 1000. Detailed descriptions of the tile spacer shown in FIG. 10 can be found in U.S. patent application Ser. No. 15/900,636, filed Feb. 20, 2018, and entitled "INTER-TILE SUPPORT FOR SOLAR ROOF TILES," the disclosure of which is incorporated herein by reference in its entirety.

In the examples shown in FIGS. 8 and 9, standalone metallic strips that thread through tile spacers are used as the inter-tile electrical coupling mechanism. During module fabrication, those standalone metallic strips are often laid down after the cascaded strings have been placed on the front or back cover of the each individual tile. Such a process can be cumbersome, because keeping the loose, standalone metallic strips in position can be difficult. In some embodiments, instead of standalone metallic strips, the inter-tile electrical coupling can be achieved using pre-laid circuit, such as metallic strips or traces that have been pre-attached to the back cover of each individual tile.

Figure 11A:
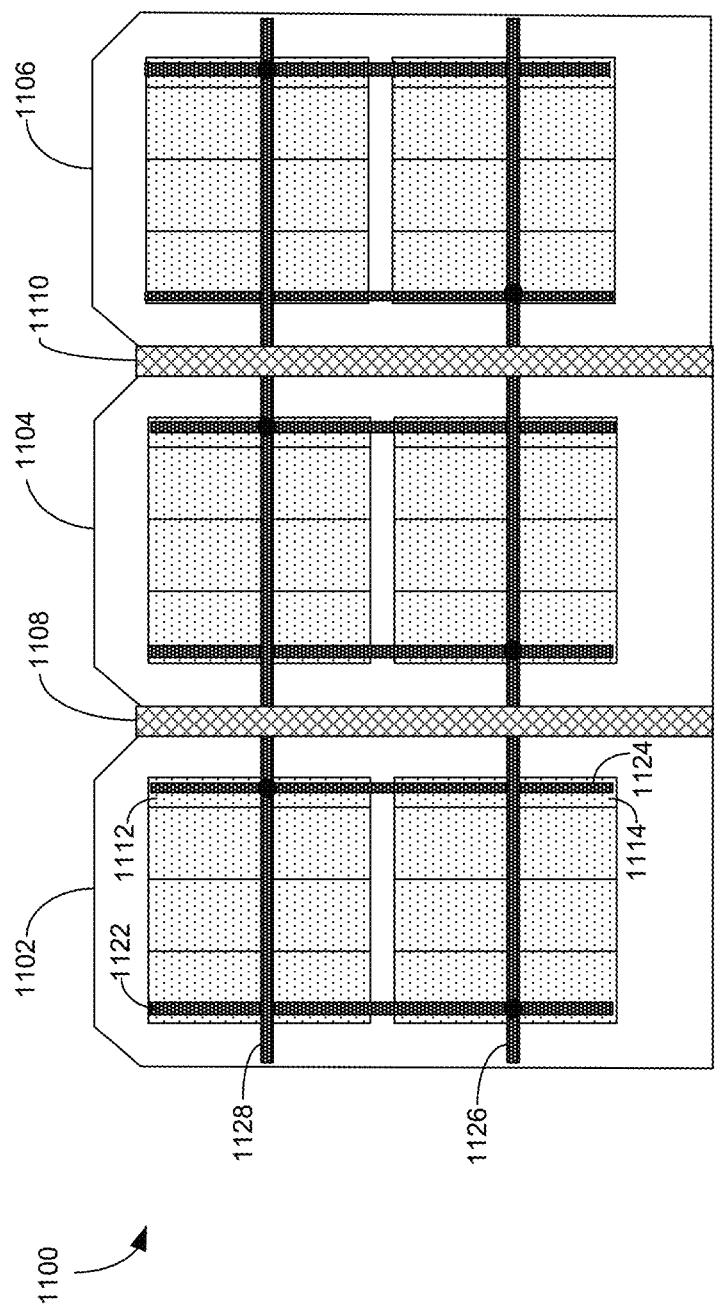
FIG. 11A shows the back view of an exemplary multi-tile module, according to one embodiment.

FIG. 11A shows the back view of an exemplary multi-tile module, according to one embodiment. For simplicity of illustration, the back covers of the individual tiles are shown as transparent to reveal components encapsulated between the front and back covers. In FIG. 11A, multi-tile module 1100 can include a number of photovoltaic roof tiles 1102, 1104, and 1106 that are coupled to each other via tile spacers 1108 and 1110. Each tile can have multiple (e.g., two) cascaded strings arranged into a vertical array. One end of each cascaded string can be attached to a bridge electrode (e.g., bridge electrodes 1112 and 1114). The back cover of each individual photovoltaic roof tile can includes a pre-laid circuit that include multiple metallic traces or strips that are attached to the back cover. For example, photovoltaic roof tile 1102 can include vertical metallic strips 1122 and 1124 and lateral metallic strips 1126 and 1128. Vertical metallic strips 1122 and 1124 can each couple to either the back-side edge busbars of the cascaded strings or the back-side edge busbars of the bridge electrodes. For example, vertical metallic strip 1122 can couple to the back-side edge busbars of both cascaded strings, and vertical metallic strip 1124 can couple to the back-side edge busbars of bridge electrodes 1112 and 1114. As discussed previously, the vertical metallic strips can facilitate in-parallel electrical coupling between the vertically arranged cascaded strings and can act as positive and negative electrodes of the photovoltaic roof tile. Each of the lateral metallic strips can be coupled to a vertical strip, thus acting as a lead wire for facilitating inter-tile electrical coupling. For example, lateral metallic strips 1126 and 1128 can couple, respectively, to vertical metallic strips 1122 and 1124. The desired electrical coupling between the vertical and lateral metallic strips can be achieved via direct metal-to-metal contact or by applying conductive paste. Note that appropriate insulation is needed to prevent unwanted electrical coupling between metallic strips that cross paths. For simplicity of illustration, the insulation is not shown and the desired electrical couplings are shown by solid circles. Detailed descriptions of the pre-laid circuit can be found in U.S. patent application Ser. No. 16/023,480, filed Jun. 29, 2018, and entitled "SOLAR ROOF TILE MODULE WITH EMBEDDED INTER-TILE CIR-CUITRY," the disclosure of which is incorporated herein by reference in its entirety.

FIG. 11A also shows that the lateral metallic strips of the different photovoltaic roof tiles are configured in such a way that a lateral metallic strip coupled to a particular type of electrode of one photovoltaic roof tile can be coupled to a lateral metallic strip coupled to the same type of electrode of a neighboring photovoltaic roof tile. In other words, the lateral metallic strips can electrically couple the different photovoltaic roof tiles in parallel. The actual coupling between lateral metallic strips of neighboring photovoltaic roof tiles is in fact facilitated by a specially designed tile spacer. More specifically, the tile spacer can include embedded circuit components for electrically coupling corresponding lateral metallic strips of neighboring photovoltaic roof tiles. Detailed descriptions of the tile spacer with embedded circuit can be found in U.S. patent application Ser. No. 16/050,994, filed Jul. 31, 2018, and entitled "SOLAR ROOF TILE SPACER WITH EMBEDDED CIRCUITRY," the disclosure of which is incorporated herein by reference in its entirety.

Figure 11B:
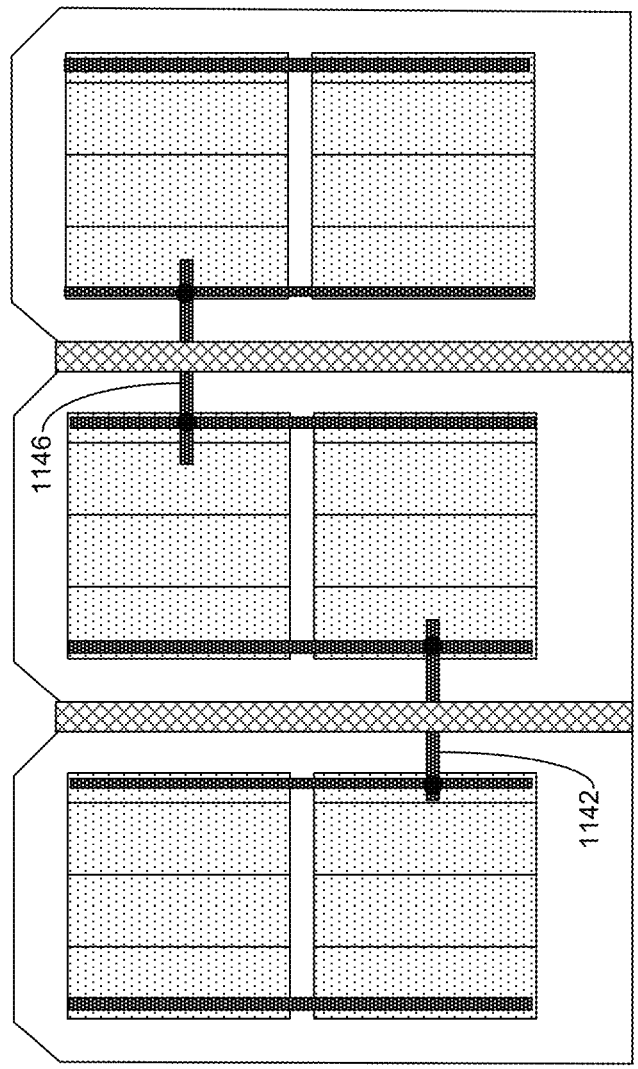
FIG. 11B shows the back view of an exemplary multi-tile module, according to one embodiment.

FIG. 11B shows the back view of an exemplary multi-tile module, according to one embodiment. Similar to FIG. 11A, the back covers of the photovoltaic roof tiles are shown as transparent. In FIG. 11B, the multiple photovoltaic roof tiles with pre-laid circuits are electrically coupled to each other in series. More specifically, multiple short lateral metallic strips (e.g., metallic strips 1142 and 1146) can be used to achieve the in-series coupling among the multiple photovoltaic roof tiles. The shortened distance of these lateral metallic strips can lower the internal resistance of the entire multi-tile module, thus enhancing the power efficiency. Compared to the multi-tile module shown in FIG. 11A, the in-series coupling of the photovoltaic roof tiles also means that the multi-tile module shown in FIG. 11B can provide a larger output voltage and a lower output current.

Figure 12:
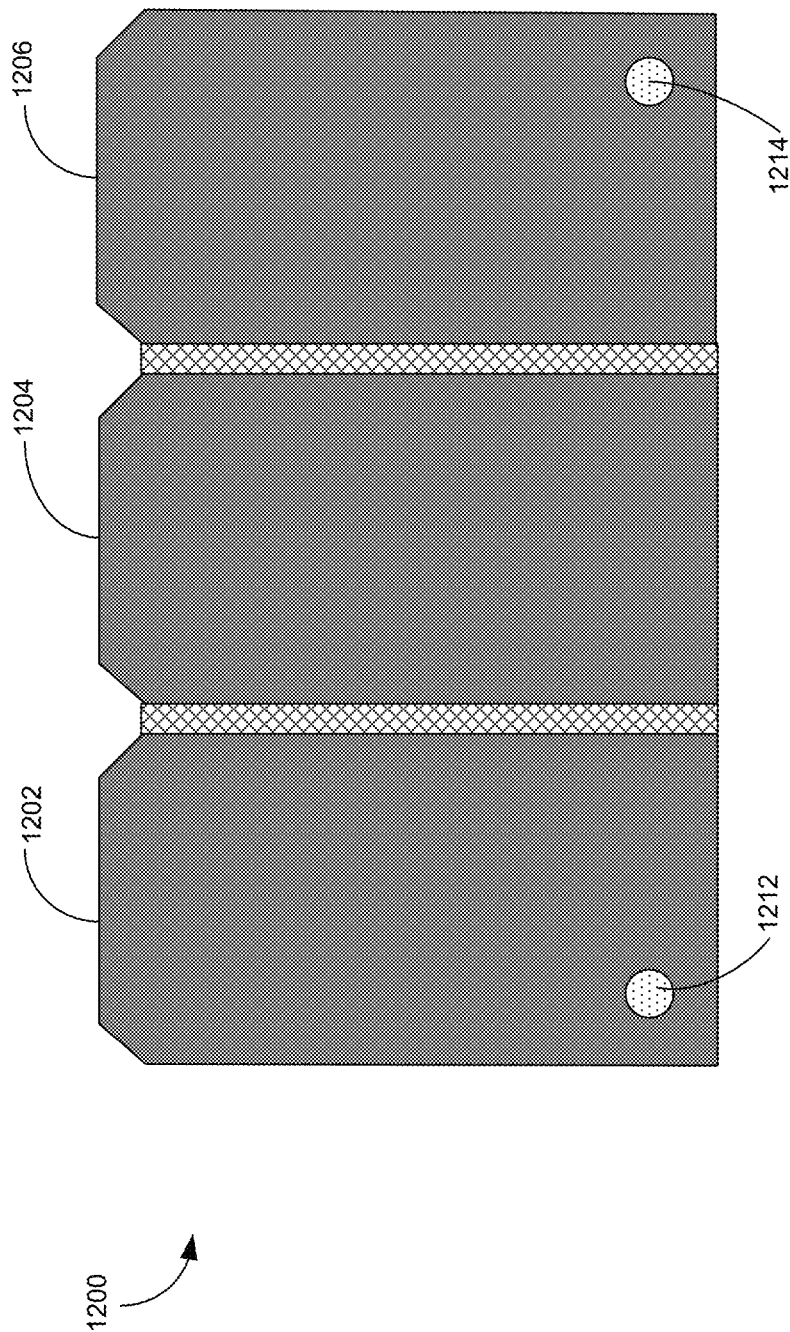
FIG. 12 shows the back side of an exemplary multi-tile module with external electrical contacts, according to one embodiment.

In addition to inter-tile electrical coupling, electrical coupling among different multi-tile modules is also needed. In some embodiments, to facilitate inter-module electrical coupling, each multi-tile module can include external electrical contacts. FIG. 12 shows the back side of an exemplary multi-tile module with external electrical contacts, according to one embodiment. In FIG. 12, multi-tile module 1200 can include multiple photovoltaic roof tiles (e.g., tiles 1202, 1204, and 1206) coupled to each other by tile spacers. In FIG. 12, the back covers of the photovoltaic roof tiles are opaque, concealing cascaded strings encapsulated inside the tiles. Multi-tile module 1200 can also include a pair of external electrical contacts (e.g., external electrical contacts 1212 and 1214) on the back covers of the photovoltaic roof tiles. For example, external electrical contact 1212 can be located on the back cover of photovoltaic roof tile 1202, and external electrical contact 1214 can be located on the back cover of photovoltaic roof tile 1206. Note that these electrical contacts are called external electrical contacts because they are exposed to the outside environment of multi-tile module 1200. In some embodiments, the outer surface of each external electrical contact can be flush with the exterior surface of the back cover, thus allowing easy access to the internal circuitry of multi-tile module 1200. For example, lead wires can be soldered onto the external electrical contacts to facilitate inter-module electrical coupling. Detailed descriptions of the external electrical contacts can be found in U.S. patent application Ser. No. 16/051,029, filed Jul. 31, 2018, and entitled "EXTERNAL ELECTRI-CAL CONTACT FOR SOLAR ROOF TILES," the disclosure of which is incorporated herein by reference in its entirety In the example shown in FIG. 12, the external electrical contacts are positioned on the two end photovoltaic roof tiles (e.g., tiles 1202 and 1206). In practice, depending on the internal circuitry design and the requirements for inter-module electrical coupling, the external electrical contacts can be placed on locations different than what's shown in FIG. 12. For example, it is also possible to have the external electrical contacts located on a same photovoltaic roof tile (e.g., middle tile 1204).

Fabrication of a Photovoltaic Roof Tile Module

Figure 13:
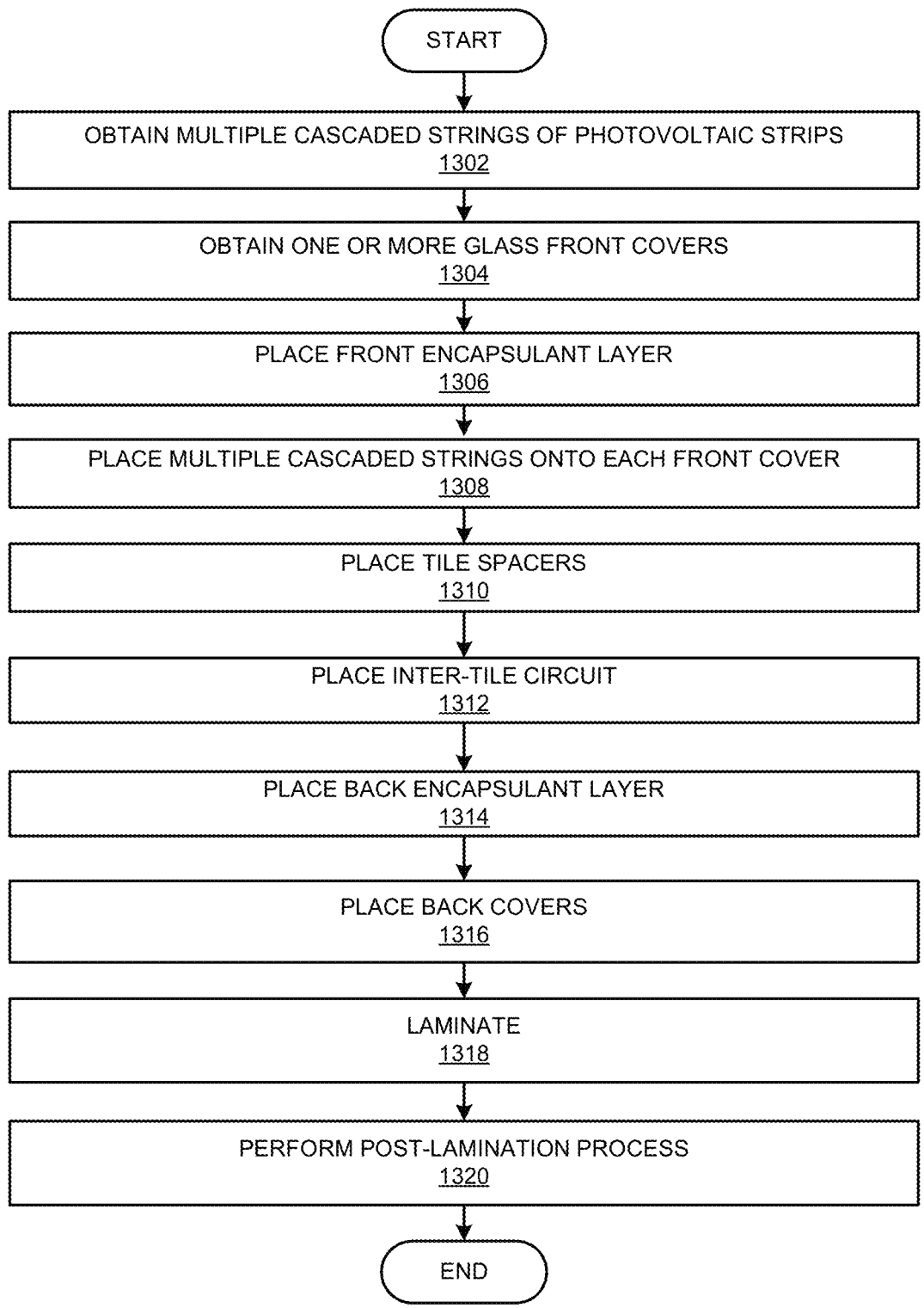
FIG. 13 presents a flowchart illustrating an exemplary process for fabricating a photovoltaic tile module, according to an embodiment.

Depending on whether or not the back covers include pre-laid circuits, the photovoltaic roof tile module may be fabricated using a slightly different process. FIG. 13 presents a flowchart illustrating an exemplary process for fabricating a photovoltaic roof tile module, according to an embodiment. The photovoltaic roof tile module can be a single-tile module or a multi-tile module that includes multiple individual photovoltaic tiles coupled to each other via tile spacers. During fabrication, multiple (e.g., two) cascaded strings of photovoltaic strips can be obtained (operation 1302). The photovoltaic strips can be obtained by dividing a standard square or pseudo-square solar cell into multiple pieces; and a string of strips can be formed by cascading multiple strips at the edges. The cascading forms a serial connection among the strips. In some embodiments, each individual solar roof tile may include at least two strings, and each string can include six cascaded strips. Detailed descriptions about the formation of a cascaded string of photovoltaic strips can be found in U.S. patent application Ser. No. 14/826,129, entitled "PHOTOVOLTAIC STRUC-TURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METH-ODS FOR SCRIBING PHOTOVOLTAIC STRUC-TURES," filed Jul. 20, 2015; U.S. patent application Ser.

No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, instead of conductive paste, electrical and mechanical bonding between the adjacent strips at their corresponding edges can be achieved via adhesive conductive films. Detailed descriptions about the bonding of adjacent photovoltaic strips using adhesive conductive films can be found in U.S. patent application Ser. No. 16/007,599, entitled "CASCADED SOLAR CELL STRING USING ADHESIVE CONDUCTIVE FILM," filed Jun. 13, 2018, the disclosure of which is incorporated herein by reference in its entirety. In addition to photovoltaic strips, each cascaded string can also include a bridge electrode that can convert the front-side edge busbar to a back-side contact.

One or more glass front covers for solar roof tiles can be obtained (operation 1304), and a front encapsulant layer can be laid onto each front cover (operation 1306). Subsequently, multiple cascaded strings can be laid onto each front glass cover, arranged in such a way that they form a vertical array (operation 1308). In some embodiments, a robotic arm with vacuum-enabled wafer pickers can pick up the cascaded strings and lay them at desired locations. Note that the arrangement of the cascaded strings ensures that the edge busbars of the same polarity of the cascaded strings are substantially aligned on a straight line. This can ensure that in-parallel coupling among the cascaded strings can be achieved using a pair of straight metallic strips. Note that, because they are laid onto the front covers, the cascaded strings are laid facing down, with their sun-facing surfaces facing downward.

If the tile module includes multiple tiles, spacers can be placed between adjacent tiles (operation 1310). The inter-tile circuit that can include multiple standalone metallic strips can be laid at appropriate locations (operation 1312). More specifically, the inter-tile circuit can include metallic strips that extend laterally across multiple tiles and vertical metallic strips for electrically coupling the multiple cascaded strings within each tile. The coupling between a metallic strip and an edge busbar of the cascaded string or the coupling between two intersecting metallic strips can be achieved using electrically conductive adhesive (ECA). Alternatively, no adhesive is needed.

Subsequently, a back encapsulant layer can then be placed on top of the cascaded strings and the inter-tile circuit (operation 1314), and glass back covers can be placed on top of the back encapsulant layer (operation 1316). In some embodiments, the glass back covers can include external electrical contacts similar to the ones shown in FIG. 12. A lamination operation can be performed to encapsulate the cascaded strings and the inter-tile circuit between the front and back covers (operation 1318). The mechanical coupling between the tile spacers is also achieved during lamination. A post-lamination process (e.g., trimming of overflowed encapsulant and attachment of the junction box and other roofing components) can then be performed to complete the fabrication of a PV roof tile (operation 1320).

Figure 14:
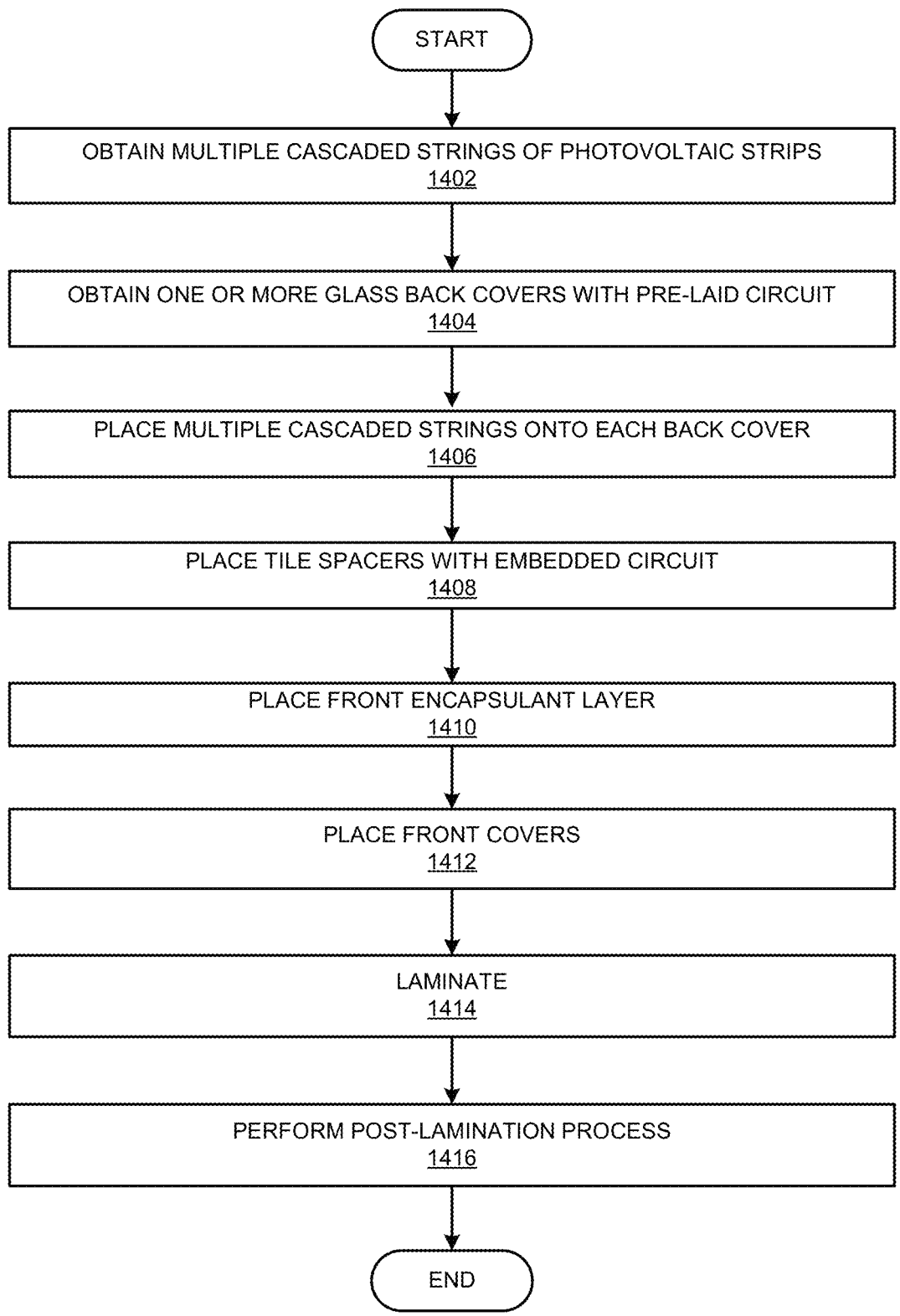
FIG. 14 presents a flowchart illustrating an exemplary process for fabricating a photovoltaic roof tile module, according to an embodiment.

FIG. 14 presents a flowchart illustrating an exemplary process for fabricating a photovoltaic roof tile module, according to an embodiment. During fabrication, multiple (e.g., two) cascaded strings of photovoltaic strips can be obtained (operation 1402). Operation 1402 can be similar to operation 1302.

A number of glass back covers with pre-laid circuit can be obtained (operation 1404). In some embodiments, the pre-laid circuit can be formed on glass substrate by attaching (e.g., using an adhesive) individual metallic strips at desired locations. In alternative embodiments, the pre-laid circuit can be formed by printing, or depositing using other metallization techniques (e.g., evaporation, sputtering, plating, etc.) metallic traces at desired locations of the back covers. Appropriate insulation is needed to prevent unwanted electrical coupling. In some embodiments, the back covers can also include external electrical contacts similar to the ones shown in FIG. 12.

The cascaded strings can then be placed onto the back covers with pre-laid circuit (operation 1406). Note that, because they are laid onto the back covers, the cascaded strings are laid with their sun-facing side up. Also note that the cascaded strings are placed in such a way that the electrodes of the cascaded strings are coupled to the pre-laid circuit, and that the cascaded strings placed on a same back cover are electrically coupled to each other in parallel.

In some embodiments, prior to laying down the cascaded strings, a back encapsulant layer can be placed on the back covers. This operation is optional and is not shown in FIG. 14. To ensure proper electrical coupling between the pre-laid circuit on the back covers and the subsequently laid cascaded strings, this back encapsulant layer does not cover the metallic strips or traces that need to be coupled to the electrodes of the cascaded strings. To do so, openings can be created on the back encapsulant layer or the back encapsulant layer can be smaller than the back cover and cover only the center portion, leaving the bordering regions, including those metallic strips needing to couple to the cascaded strings, uncovered.

If the tile module is a multi-tile module, specially designed tile spacers with embedded circuit can be placed between the tile covers (operation 1408). In some embodiments, a tile spacer can be formed by first forming (e.g., using a molding technique) upper and lower portions of the tile spacer and then placing one or more metallic strips between the upper and lower portions of the tile spacer in such a way that the metallic strips are sandwiched between the upper and lower portions of the tile spacer with their ends extending beyond either side of the tile spacer. In some embodiments, forming a tile spacer can involve placing, beforehand, one or more metallic strips inside a mold for the tile spacer, and then injecting molting thermalplastic (e.g., PVDF or PTFE) into the mold. The metallic strips can be shaped into a desired shape and placed at a desired location. Therefore, after cooling, a tile spacer with embedded metallic strips can be obtained. The length of the metallic strips can be designed such that the two ends of a metallic strip can extend beyond the two wings of the tile spacer. In some embodiments, the tile spacers can be placed in such a way that the base of a tile spacer snugly fits in the space between two adjacent back tile covers, with its two wings positioned above the back covers. More specifically, the metallic strips extending out of the wings can come into contact with the pre-laid circuit on the back tile covers. In some embodiments, conductive paste or film can be deposited onto the pre-laid circuit to facilitate electrical coupling between the embedded circuit in the tile spacer and the pre-laid circuit on the back covers.

Subsequently, a front encapsulant layer can then be placed on top of the cascaded strings (operation 1410), and front glass covers can be placed on top of the front encapsulant layer (operation 1412). A lamination operation can be performed to encapsulate the cascaded strings between the front and back covers (operation 1414). A post-lamination process (e.g., trimming of overflowed encapsulant and attachment of the junction box and other roofing components) can then be performed to complete the fabrication of a PV roof tile (operation 1416).

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof tile module, comprising at least:
    a first photovoltaic roof tile and a second photovoltaic roof tile positioned adjacent to the first photovoltaic roof tile and offset from the first photovoltaic roof tile in a first direction, wherein a respective photovoltaic roof tile comprises:
        a front glass cover;
        a back cover; and
        a plurality of cascaded strings encapsulated between the front glass cover and the back cover, wherein each cascaded string of the plurality of cascaded strings (e.g., 812) comprises a plurality of photovoltaic structures electrically coupled to each other in series, wherein a first photovoltaic structure of the plurality of photovoltaic structures is offset from a second photovoltaic structure of the plurality of photovoltaic structures in the first direction,
        wherein a first cascaded string of the plurality of cascaded strings is electrically coupled to a second cascaded string in parallel and wherein the first cascaded string is offset from the second cascaded string in a second direction orthogonal to the first direction and wherein a respective photovoltaic structure comprises a first edge busbar positioned near an edge of a first surface and a second edge busbar positioned near an opposite edge of a second surface, and wherein the plurality of photovoltaic structures are arranged in such a way that the first edge busbar of a first photovoltaic structure overlaps the second edge busbar of an adjacent photovoltaic structure.

2. The photovoltaic roof tile module of claim 1, wherein the multiple cascaded strings are arranged in such a way that an edge busbar of a first cascaded string and a corresponding edge busbar of a second cascaded string are substantially aligned in a straight line.

3. The photovoltaic roof tile module of claim 2, further comprising a metallic strip coupled to the corresponding edge busbars of the first and second cascaded strings to enable the in-parallel coupling between the first and second cascaded strings.

4. The photovoltaic roof tile module of claim 1, wherein the first photovoltaic structure comprises a first portion of a solar cell and the second photovoltaic structure comprises a second portion of the solar cell and wherein the first portion of the solar cell overlaps the second portion of the solar cell.

5. The photovoltaic roof tile module of claim 1, further comprising:
    a spacer coupled directly to and positioned between the first photovoltaic roof tile and the second photovoltaic roof tile.

6. The photovoltaic roof tile module of claim 5,
    a metallic strip electrically coupling the first photovoltaic roof tile to the second photovoltaic roof tile,
    wherein the spacer defines a channel configured to accommodate the passage of the metallic strip through the spacer.

7. The photovoltaic roof tile module of claim 1, wherein each of the first and second photovoltaic roof tiles is oriented in a portrait fashion, and wherein the first and second photovoltaic roof tiles are placed in such a way that a longer edge of the first photovoltaic roof tile is adjacent to a corresponding longer edge of the second photovoltaic roof tile.

8. The photovoltaic roof tile module of claim 1, wherein each back cover comprises:
    a glass substrate; and
    a pre-laid circuit attached to the glass substrate.

9. The photovoltaic roof tile module of claim 1, wherein the first cascaded string and the second cascaded strings of the first photovoltaic roof tile are electrically coupled in series to the first cascaded string and the second cascaded string of the second photovoltaic roof tile.

10. The photovoltaic roof tile module of claim 1, wherein the first cascaded string of the first photovoltaic roof tile is separated by a gap from the second cascaded string of the first photovoltaic roof tile.

11. The photovoltaic roof tile module of claim 1, wherein the first photovoltaic roof tile has a shape and size of a conventional roof tile.

12. The photovoltaic roof tile module of claim 1, wherein the front glass cover of the first photovoltaic roof tile is separate and distinct from the front glass cover of the second photovoltaic roof tile.

* * * * *